(12) United States Patent
Kim

(10) Patent No.: US 12,400,969 B2
(45) Date of Patent: Aug. 26, 2025

(54) PACKAGE SUBSTRATES AND SEMICONDUCTOR PACKAGES HAVING THE SAME

(71) Applicant: SAMSUNG ELECTRONICS CO., LTD., Suwon-si (KR)

(72) Inventor: Hyejin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 17/938,665

(22) Filed: Oct. 6, 2022

(65) Prior Publication Data

US 2023/0197626 A1   Jun. 22, 2023

(30) Foreign Application Priority Data

Dec. 16, 2021  (KR) .......................... 10-2021-0181034

(51) Int. Cl.
*H01L 23/544* (2006.01)
*H01L 23/00* (2006.01)
(Continued)

(52) U.S. Cl.
CPC ...... *H01L 23/544* (2013.01); *H01L 23/49811* (2013.01); *H01L 23/49822* (2013.01);
(Continued)

(58) Field of Classification Search
CPC ............. H01L 23/544; H01L 23/49811; H01L 23/49822; H01L 23/36
See application file for complete search history.

(56) References Cited

U.S. PATENT DOCUMENTS 6,324,068 B1   11/2001   Shimizu et al.
7,129,146 B2   10/2006   Hsu
(Continued)

FOREIGN PATENT DOCUMENTS

JP   2004-214700   7/2004
KR   10-0173249   10/1998
(Continued)

OTHER PUBLICATIONS

Notice of Allowance dated Jun. 19, 2025 issued in corresponding Korean Patent Application No. 10-2021-0181034.

*Primary Examiner* — Thao P Le
(74) *Attorney, Agent, or Firm* — Morgan, Lewis & Bockius LLP

(57) ABSTRACT

A package substrate includes at least one substrate base, a plurality of wiring patterns disposed on an upper surface and a lower surface of the at least one substrate base and extending in a horizontal direction, a plurality of wiring vias extending in a vertical direction through the at least one substrate base and electrically connecting two wiring patterns positioned at different vertical levels among the plurality of wiring patterns, to each other, and an upper surface solder resist layer having a plurality of first upper surface openings extending from the upper surface to the lower surface, and at least two upper surface openings having a second opening width as a horizontal width that is greater than a first opening width which is a horizontal width of the plurality of first upper surface openings, the upper surface solder resist layer covering an upper surface of the at least one substrate base.

20 Claims, 19 Drawing Sheets

(51) Int. Cl.
*H01L 23/498* (2006.01)
*H01L 23/36* (2006.01)

(52) U.S. Cl.
CPC .. *H01L 23/49827* (2013.01); *H01L 23/49838* (2013.01); *H01L 24/16* (2013.01); *H01L 23/36* (2013.01); *H01L 24/29* (2013.01); *H01L 24/32* (2013.01); *H01L 24/33* (2013.01); *H01L 24/73* (2013.01); *H01L 2223/54426* (2013.01); *H01L 2224/16227* (2013.01); *H01L 2224/2929* (2013.01); *H01L 2224/29386* (2013.01); *H01L 2224/32225* (2013.01); *H01L 2224/33181* (2013.01); *H01L 2224/73204* (2013.01); *H01L 2224/73253* (2013.01)

(56) References Cited

U.S. PATENT DOCUMENTS

| | | |
|---|---|---|
| 7,960,837 B2 | 6/2011 | Inoue |
| 8,232,841 B1 | 7/2012 | Ozawa et al. |
| 10,867,974 B2 | 12/2020 | Kim |
| 2015/0147846 A1 | 5/2015 | Feger et al. |
| 2016/0367277 A1 | 12/2016 | Nagai et al. |
| 2018/0151495 A1 | 5/2018 | Hsu et al. |
| 2021/0005561 A1 | 1/2021 | Hu et al. |
| 2021/0407923 A1* | 12/2021 | Kim ........................ H01L 25/16 |
| 2022/0359323 A1* | 11/2022 | Huang .................... H01L 23/31 |
| 2022/0384320 A1* | 12/2022 | Lee ........................ H01L 23/642 |
| 2024/0145437 A1* | 5/2024 | Hwang .................... H01L 24/32 |
| 2024/0321775 A1* | 9/2024 | Lee ........................ H01L 23/562 |
| 2025/0006619 A1* | 1/2025 | Lee .................... H01L 23/49822 |
| 2025/0046769 A1* | 2/2025 | Choi ....................... H01L 24/20 |

FOREIGN PATENT DOCUMENTS

| | | |
|---|---|---|
| KR | 10-2006-0026191 | 3/2006 |
| KR | 10-2009-0063104 A | 6/2009 |
| KR | 10-2020-0004112 A | 1/2020 |

\* cited by examiner

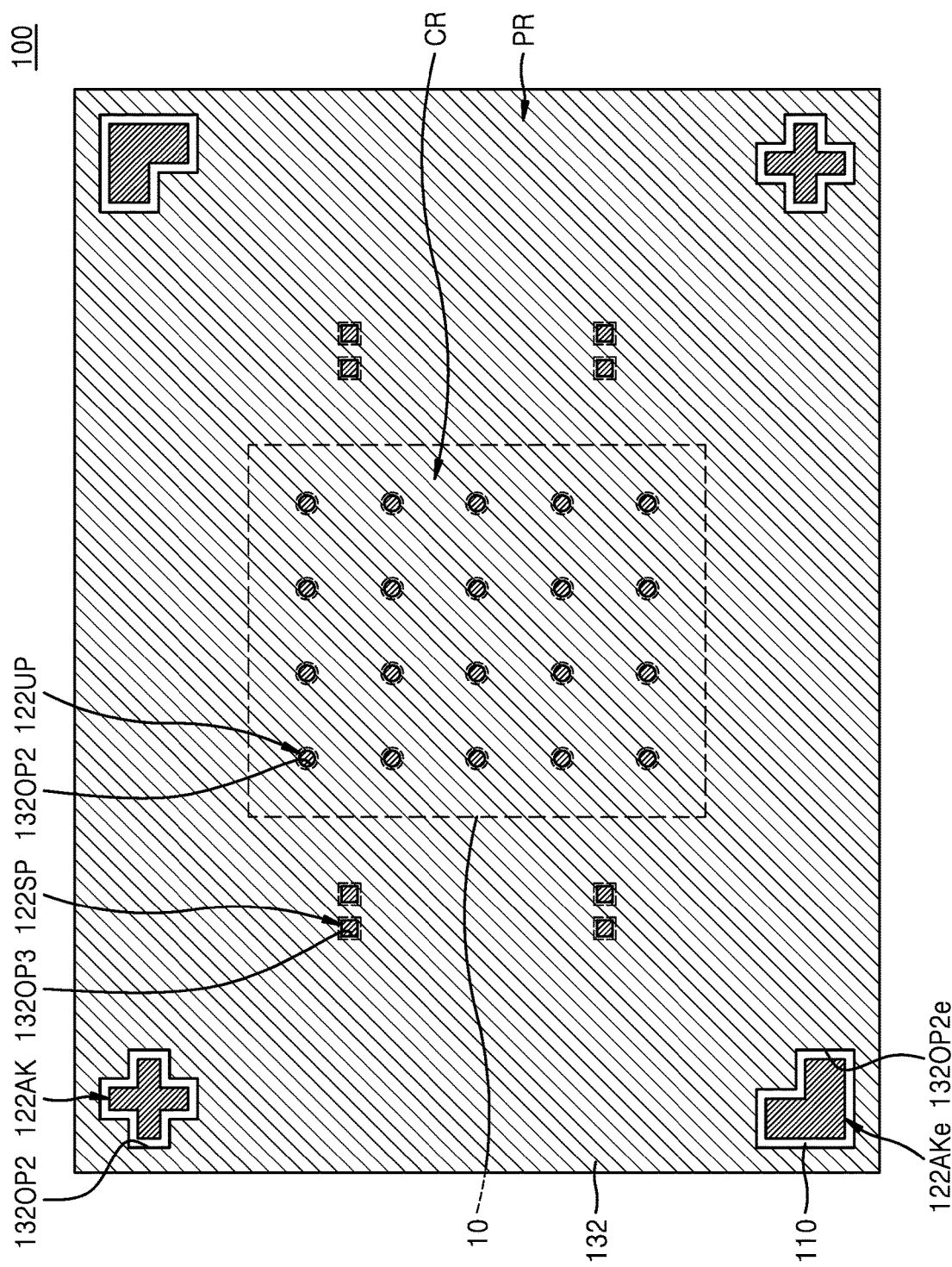

PACKAGE SUBSTRATES AND SEMICONDUCTOR PACKAGES HAVING THE SAME

CROSS-REFERENCE TO RELATED APPLICATION

This application is based on and claims priority under 35 U.S.C. § 119 to Korean Patent Application No. 10-2021-0181034, filed on Dec. 16, 2021 in the Korean Intellectual Property Office, the disclosure of which is incorporated by reference herein in its entirety.

TECHNICAL FIELD

The disclosure relates to semiconductor packages and, more particularly, to a package substrate and a semiconductor package including the package substrate.

DISCUSSION OF THE RELATED ART

In accordance with the rapid development of the electronics industry and the needs of users, electronic devices are becoming smaller, more multifunctional, and larger in capacity. Accordingly, highly integrated semiconductor chips are being designed, and the number and arrangement density of connection terminals for input/output (I/O) are increasing in highly integrated semiconductor chips.

This high density of connection terminals may render semiconductor packages difficult to mount within electronic devices.

SUMMARY

A package substrate includes at least one substrate base, a plurality of wiring patterns disposed on upper and lower surfaces of the at least one substrate base and extending in a horizontal direction, a plurality of wiring vias extending in a vertical direction through the substrate base and electrically connecting two wiring patterns positioned at different vertical levels among the plurality of wiring patterns to one another, and an upper surface solder resist layer having a plurality of first upper surface openings extending from the upper surface to the lower surface, and at least two upper surface openings having a second opening width as a horizontal width that is greater than a first opening width which is a horizontal width of the plurality of first upper surface openings. The upper surface solder resistant layer covers an upper surface of the at least one substrate base. The plurality of wiring patterns includes a plurality of upper surface connection pads disposed in the plurality of first upper surface openings on the upper surface of the at least one substrate base and having a circular or elliptical shape, in a plan view, and at least two alignment patterns disposed in the at least two second upper surface openings on the upper surface of the at least one substrate base and having a vertex shape, in the plan view. Tn the first upper surface opening, a portion of the upper surface of the at least one substrate base is entirely covered by the upper surface connection pad. In the second upper surface opening, a portion of the upper surface of the at least one substrate base is covered by the alignment pattern and a remaining portion of the upper surface of the at least one substrate base is not covered by the alignment pattern.

A semiconductor package includes a package substrate having a chip attachment region and a peripheral region surrounding the chip attachment region, in a plan view. A semiconductor chip having first and second surfaces opposite to each other and including a plurality of chip pads is disposed on the first surface, the first surface facing an upper surface of the package substrate and attached to the chip attachment region of the package substrate. A plurality of chip connection members is attached to the plurality of chip pads. The package substrate includes at least one substrate base. An upper surface solder resist layer covers an upper surface of the at least one substrate base, having a plurality of first upper surface openings disposed in the chip attachment region and a second opening width that is greater than a first opening width that is a horizontal width of the plurality of first upper surface openings as a horizontal width, and having at least two upper surface openings disposed in the peripheral region. A plurality of upper surface connection pads is disposed in the plurality of first upper surface openings on the upper surface of the at least one substrate base and having a circular or elliptical shape, in a plan view, and having the plurality of chip connection members attached thereto. At least two alignment patterns are disposed in the at least two second upper surface openings on the upper surface of the at least one substrate base and having a shape, in the plan view, with at least three vertices. the upper surface solder resist layer covers all side surfaces of the plurality of upper surface connection pads, but does not cover at least a portion of side surfaces of the at least two alignment patterns.

A semiconductor package includes a package substrate having a chip attachment region and a peripheral region surrounding the chip attachment region, in a plan view. A semiconductor chip has first and second surfaces opposite to each other and includes a plurality of chip pads disposed on the first surface. The first surface faces an upper surface of the package substrate and is attached to the chip attachment region of the package substrate. A plurality of chip connection members is attached to the plurality of chip pads. The package substrate includes at least one substrate base, an upper surface solder resist layer covering an upper surface of the at least one substrate base and having a plurality of first upper surface openings disposed in the chip attachment region and at least two upper surface openings having a second opening width that is greater than a first opening width that is a horizontal width of the plurality of first upper surface openings and disposed in the peripheral region. A lower surface solder resist layer covers the lower surface of the at least one substrate base and has a plurality of lower surface openings disposed in the chip attachment region and the peripheral region. A plurality of upper surface connection pads is disposed in the plurality of first upper surface openings on the upper surface of the at least one substrate base and having a circular or elliptical shape, in a plan view, and having the plurality of chip connection members attached thereto. At least two alignment patterns are disposed in the at least two second upper surface openings on the upper surface of the at least one substrate base and have a shape, in a plan view, with at least three vertices. A plurality of lower surface connection pads is disposed in the plurality of lower surface openings on the lower surface of the at least one substrate base. A plurality of external connection terminals is attached to the plurality of lower surface connection pads. The upper surface solder resist layer covers all side surfaces of the plurality of upper surface connection pads, but does not cover at least a portion of side surfaces of the at least two alignment patterns. A portion of a side surface of the upper surface solder resist layer defining the second upper surface opening and a portion of the side surface of the alignment pattern are spaced apart from each other by a first interval that is less than the first opening width in a horizontal direction.

BRIEF DESCRIPTION OF THE DRAWINGS

Embodiments of the inventive concept will be more clearly understood from the following detailed description taken in conjunction with the accompanying drawings, in which:

FIG. 10 is a plan view taken from above a package substrate according to the inventive concept.

DETAILED DESCRIPTION OF THE EMBODIMENTS

Figure 1:
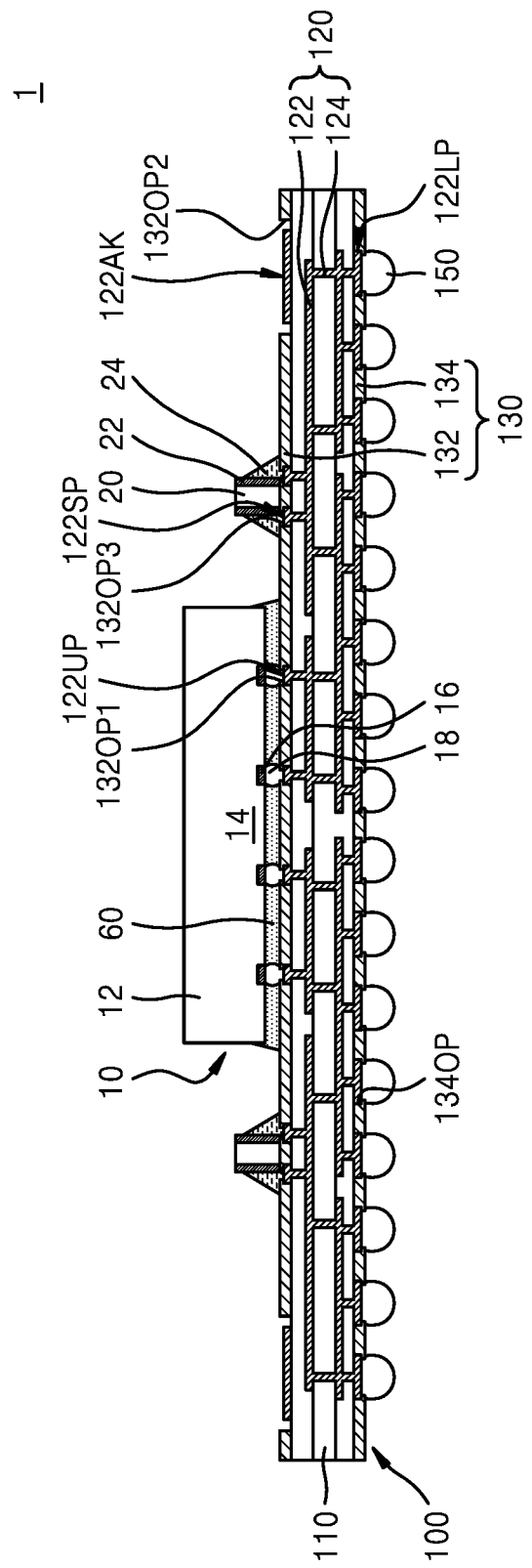
FIG. 1 is a cross-sectional view showing a semiconductor package including a package substrate according to the inventive concept.

In describing embodiments of the disclosure illustrated in the drawings, specific terminology is employed for sake of clarity. However, the disclosure is not necessarily intended to be limited to the specific terminology so selected, and it is to be understood that each specific element includes all technical equivalents which operate in a similar manner.

FIG. 1 is a cross-sectional view showing a semiconductor package including a package substrate according to the inventive concept.

Referring to FIG. 1, a semiconductor package 1 includes a package substrate 100 and a semiconductor chip 10 attached to an upper surface of the package substrate 100. The semiconductor package 1 may be, for example, a Flip Chip Ball Grid Array (FCBGA) package or a Flip Chip Package Ball Grid Array (FCPBGA) package.

In some embodiments, the package substrate 100 may be a printed circuit board (PCB). For example, the package substrate 100 may be a double-sided printed circuit board or a multi-layer printed circuit board. The package substrate 100 may include at least one substrate base 110 and a substrate wiring structure 120. The substrate wiring structure 120 may include a plurality of wiring patterns 122 disposed on the upper and lower surfaces of the substrate base 110 and/or disposed inside the substrate base 110 and extending in the horizontal direction, and a plurality of wiring vias 124 penetrating at least a portion of the at least one substrate base 110 and extending in a vertical direction electrically connecting two wiring patterns 122 located at different vertical levels, among the plurality of wiring patterns 122, to each other. In some embodiments, the package substrate 100 may include a plurality of stacked substrate bases 110, and the plurality of wiring patterns 122 may be disposed on the upper and lower surfaces of each of the plurality of substrate bases 110.

In this specification, the plurality of substrate bases 110 may include either only a single substrate base 110 or multiple substrate bases 110 stacked upon each other and, as used herein, the phrase "the plurality of substrate base 110" may refer to a sole substrate base 110. Similarly, the phrase "the substrate base 110" may refer to a plurality of substrate bases 110.

The package substrate 100 may further include a solder resist layer 130 covering the upper and lower surfaces of the at least one substrate base 110. The solder resist layer 130 may include an upper surface solder resist layer 132, covering the upper surface of the at least one substrate base 110, and a lower surface solder resist layer 134, covering the lower surface of the at least one substrate base 110.

Some of the wiring patterns 122 disposed on the upper surface of the at least one substrate base 110 might not be covered by the upper surface solder resist layer 132. For example, the plurality of upper surface connection pads 122UP, at least two device connection pads 122SP, and at least two alignment patterns 122AK, which are some of the wiring patterns 122 disposed on the upper surface of at least one substrate base 110, might not be covered by the upper surface solder resist layer 132. In some embodiments, the upper surface solder resist layer 132 may cover the side surfaces of the plurality of upper surface connection pads 122UP and the at least two device connection pads 122SP, but might not cover the upper surface. In some embodiments, the upper surface solder resist layer 132 might not cover upper surfaces and side surfaces of the at least two alignment patterns 122AK.

A plurality of chip connection members 18 may be attached to the plurality of upper surface connection pads 122UP. The plurality of chip connection members 18 may completely cover the surfaces, for example, the upper surfaces, of the plurality of upper surface connection pads 122UP that are not covered by the upper surface solder resist layer 132. The upper surface and the side surfaces of the plurality of upper surface connection pads 122UP may be fully covered by the plurality of chip connection members 18 and the upper surface solder resist layer 132. At least two element terminals 22 of the unit element chip 20 may be electrically connected to the at least two element connection pads 122SP. In some embodiments, the element connection pad 122SP and the element terminal 22 may be electrically connected by an electrically conductive solder 24. The electrically conductive solder 24 may completely cover the surfaces, for example, the upper surface, of the plurality of element connection pads 122SP not covered by the upper surface solder resist layer 132. Upper surfaces and side surfaces of the at least two alignment patterns 122AK may be externally exposed without being covered by the upper surface solder resist layer 132.

An underfill layer 60 may be arranged between the semiconductor chip 10 and the package substrate 100 and may surround the plurality of chip connection members 18 and fill the space between the semiconductor chip 10 and the package substrate 100. The underfill layer 60 may include a resin. For example, the underfill layer 60 may be formed of an epoxy resin by a capillary under-fill method. A filler may be mixed in the underfill layer 60, and the filler may be formed of, for example, silica.

The upper surface solder resist layer 132 might not cover a portion of the upper surface of the at least one substrate base 110. For example, the upper surface solder resist layer 132 might not cover a portion of the upper surface of the at least one substrate base 110 positioned around the at least two alignment patterns 122AK. The upper surface solder resist layer 132 may be spaced apart from at least two alignment patterns 122AK, and a portion of the upper surface of the at least one substrate base 110 may be externally exposed without being covered by the upper surface solder resist layer 132 and the at least two alignment patterns 122AK between the upper surface solder resist layer 132 and at least two alignment patterns 122AK that are spaced apart from each other.

The upper surface solder resist layer 132 may have a plurality of first upper surface openings 132OP1, at least two second upper surface openings 132OP2, and at least two third upper surface openings 132OP3, which extend from the upper surface to the lower surface of the upper surface solder resist layer 132. A plurality of upper surface connection pads 122UP may be disposed in the plurality of first upper surface openings 132OP1. At least two alignment patterns 122AK may be disposed in the at least two second upper surface openings 132OP2. At least two element connection pads 122SP may be disposed in the at least two third upper surface openings 132OP3. A plurality of first upper surface openings 132OP1 may be disposed in the chip attachment region, and at least two second upper surface openings 132OP2 may be disposed in the peripheral region.

A portion of the upper surface of at least one substrate base 110 in the plurality of first upper surface openings 132OP1 may be fully covered by the plurality of upper surface connection pads 122UP. A portion of the upper surface of the at least one substrate base 110 in the at least two second upper surface openings 132OP2 may be covered by the at least two alignment patterns 122AK, and the remaining portion may be uncovered and exposed. A portion of the upper surface of at least one substrate base 110 in the at least two third upper surface openings 132OP3 may be fully covered by at least two element connection pads 122SP.

A plurality of upper surface connection pads 122UP, at least two element connection pads 122SP, and at least two alignment patterns 122AK are parts of the wiring patterns 122 and may be made of the same material.

Some of the wiring patterns 122 disposed on the lower surface of the at least one substrate base 110 might not be covered by the lower surface solder resist layer 134. For example, the plurality of lower surface connection pads 122LP that are parts of the wiring patterns 122 disposed on the lower surface of at least one substrate base 110 might not be covered by the lower surface solder resist layer 134. In some embodiments, the lower surface solder resist layer 134 might not cover the lower surfaces of the plurality of lower surface connection pads 122LP. A plurality of external connection terminals 150 may be attached to the plurality of lower surface connection pads 122LP. The plurality of external connection terminals 150 may completely cover the surface, for example, the lower surface, of the plurality of lower surface connection pads 122LP not covered by the lower surface solder resist layer 134. In some embodiments, the external connection terminal 150 may be a solder ball.

The lower surface solder resist layer 134 may have a plurality of lower surface openings 134OP extending from the upper surface to the lower surface. The plurality of lower surface openings 134OP may be disposed in the chip attachment region and the peripheral region. A plurality of lower surface connection pads 122LP may be disposed in the plurality of lower surface openings 134OP. A portion of the lower surface of the at least one substrate base 110 in the plurality of lower surface openings 134OP may be fully covered by the plurality of lower surface connection pads 122LP.

The plurality of upper surface connection pads 122UP may be electrically connected to the plurality of lower surface upper surface connection pads 122LP through some of the plurality of wiring vias 124. In some embodiments, the plurality of upper surface connection pads 122UP may be electrically connected to the plurality of lower surface upper surface connection pads 122LP through some of the plurality of wiring vias 124 and other portions of the plurality of wiring patterns 122. For example, in each of the plurality of upper surface connection pads 122UP, at least one wiring via 124 may be connected to the lower surface or at least one wiring pattern 122 may be connected to a side surface.

At least two alignment patterns 122AK each might not be electrically connected to the remainder of the substrate wiring structure 120, which may include, the remaining wiring patterns 122 except for one alignment pattern 122AK among the plurality of wiring patterns 122, and the plurality of wiring vias 124. For example, each of the at least two alignment patterns 122AK may be electrically floated. The entire lower surface of each of the at least two alignment patterns 122AK may be in contact with the upper surface of the at least one substrate base 110.

The substrate base 110 may be made of phenol resin, epoxy resin, and/or polyimide. The substrate base 110 may include, for example, Frame Retardant 4 (FR4), Tetrafunctional epoxy, Polyphenylene ether, Epoxy/polyphenylene oxide, Bismaleimide triazine (BT), Thermount, Cyanate ester, Polyimide, and/or Liquid crystal polymer.

The substrate wiring structure 120 may include copper. For example, each of the plurality of wiring patterns 122 and the plurality of wiring vias 124 may consist of electrolytically deposited (ED) copper foil, rolled-annealed (RA) copper foil, ultra-thin copper foil, sputtered copper, copper alloys, and the like.

The solder resist layer 130, including the upper surface solder resist layer 132 and the lower surface solder resist layer 134, may be formed of a polyimide film, a polyester film, a flexible solder mask, a photoimageable coverlay (PIC), a photo-imagable solder resist, or the like. For example, after applying the thermosetting ink directly to the upper surface and the lower surface of at least one substrate base 110 by silk screen printing method or ink jet method, the solder resist layer 130 may be formed by heat, UV, or IR curing. For example, after applying the photosensitive solder resist to the upper surface and the lower surface of at least one substrate base 110 by a screen method or a spray coating method, the solder resist layer 130 may be formed by removing unnecessary portions through exposure and development and curing with UV or IR. The solder resist layer 130 may be formed by, for example, a laminating method of adhering a polyimide film or a polyester film to the upper and lower surfaces of the at least one substrate base 110.

The semiconductor chip 10 may include a semiconductor substrate 12 having an active surface and an inactive surface opposite to each other; a semiconductor element 14 formed on the active surface of the semiconductor substrate 12; and a plurality of chip pads 16 disposed on a first side surface of the semiconductor chip 10. In this specification, the first surface of the semiconductor chip 10 and the second surface of the semiconductor chip 10 are opposite to each other, and the second surface of the semiconductor chip 10 refers to the inactive surface of the semiconductor substrate 12. Since the active surface of the semiconductor substrate 12 is adjacent to the first surface of the semiconductor chip 10, a single illustration is used to show the active surface of the semiconductor substrate 12 and the first surface of the semiconductor chip 10.

In some embodiments, the semiconductor chip 10 has a face down arrangement in which the first surface faces the package substrate 100, and may be attached to the upper surface of the package substrate 100. In this case, the first surface of the semiconductor chip 10 may be referred to as a lower surface of the semiconductor chip 10, and the second surface of the semiconductor chip 10 may be referred to as an upper surface of the semiconductor chip 10.

A plurality of chip connection members 18 may be arranged between the plurality of chip pads 16 of the semiconductor chip 10 and the plurality of upper surface connection pads 122UP of the package substrate 100. For example, the chip connection member 18 may be a solder ball or a micro bump. The semiconductor chip 10 and the package substrate 100 may be electrically connected through a plurality of chip connection members 18.

The plurality of chip connection members 18 may be attached to the plurality of connection pads 122UP. Each of the chip connection members 18 may completely fill a portion of the first upper surface opening 132 OP1 that is not filled by the connection pad 122UP. For example, the first upper surface opening 132OP1 may be completely filled by the connection pad 122UP and the chip connection member 18.

A portion of the package substrate 100 overlapping the semiconductor chip 10 in the vertical direction may be referred to as a chip attachment region, and the remaining portion of the package substrate 100, for example, a portion of the package substrate 100 that does not overlap the semiconductor chip 10 in a vertical direction, may be referred to as a peripheral region. A plurality of upper surface connection pads 122UP may be disposed in the chip attachment region of the package substrate 100, and at least two alignment patterns 122AK may be disposed in the peripheral region. At least two element connection pads 122SP may be disposed in the peripheral region, but the inventive concept is not necessarily limited thereto. For example, a portion of the at least two element connection pads 122SP may be disposed in a portion where the plurality of upper surface connection pads 122UP are not disposed in the chip attachment region. A plurality of lower surface connection pads 122LP may be disposed in the chip attachment region and the peripheral region.

Unless otherwise specified in the specification, the upper surface refers to a surface facing upward in the drawing, and the lower surface refers to a surface facing downward in the drawing.

The semiconductor substrate 12 may include, for example, a semiconductor material such as silicon (Si) or germanium (Ge). Alternatively, the semiconductor substrate 12 may include a compound semiconductor material such as silicon carbide (SiC), gallium arsenide (GaAs), indium arsenide (InAs), and indium phosphide (InP). The semiconductor substrate 12 may include an electrically conductive area, for example, a well doped with impurities. The semiconductor substrate 12 may have various element isolation structures such as a shallow trench isolation (STI) structure.

A semiconductor element 14 including a plurality of individual devices of various types may be formed on the active surface of the semiconductor substrate 12. The plurality of individual devices may include various microelectronic devices, for example, a metal-oxide-semiconductor field effect transistor (MOSFET) such as a complementary metal-insulator-semiconductor (CMOS) transistor, a system large scale integration (LSI), an active element, a passive element, and the like. The plurality of individual devices may be electrically connected to the electrically conductive area of the semiconductor substrate 12. The semiconductor element 14 may further include at least two of the plurality of individual devices, or an electrically conductive wire or an electrically conductive plug electrically connecting the plurality of individual devices to the electrically conductive area of the semiconductor substrate 12. In addition, each of the plurality of individual devices may be electrically isolated from neighboring individual devices by an insulating film.

In some embodiments, the semiconductor chip 10 may be a System on Chip (SoC), a central processing unit (CPU) chip, a graphics processing unit (GPU) chip, or an application processor (AP) chip. In some other embodiments, the semiconductor chip 10 may be, for example, a memory semiconductor chip. The memory semiconductor chip may be, for example, a non-volatile memory semiconductor chip such as a flash memory, a phase-change random access memory (PRAM), a magnetoresistive random access memory (MRAM), a ferroelectric random access memory (FeRAM), or a resistive random access memory (RRAM). The flash memory may be, for example, a NAND flash memory or a V-NAND flash memory. In some embodiments, the semiconductor chip 10 may be a volatile memory semiconductor chip such as a dynamic random access memory (DRAM) or a static random access memory (SRAM).

In some embodiments, the semiconductor package 1 may further include at least one unit element chip 20 attached to the package substrate 100. The unit element chip 20 may be attached to the upper surface of the package substrate 100 and may be horizontally spaced apart from the semiconductor chip 10. The unit element chip 20 may be a passive element or an active element. For example, the passive element may be a resistor, an inductor, or a capacitor, and the active element may be a transistor, a diode, or an operational amplifier. In some embodiments, the unit element chip 20 may be an intermediate storage capacitor (ISC). For example, the unit element chip 20 may be a ceramic capacitor or a ceramic resistor. The unit element chip 20 may have two element terminals 22. At least two element terminals 22 of at least one unit element chip 20 may be electrically connected to at least two element connection pads 122SP. An electrically conductive solder 24 may be arranged between the element terminal 22 and the element connection pad 122SP. The chip connection member 24 may completely fill a portion of the first upper surface opening 132 OP1 that is not filled by the connection pad 122UP. For example, all of the third upper surface opening 132OP3 may be filled by the element connection pad 122SP and the electrically conductive solder 24. In some other embodiments, the semiconductor package 1 includes a plurality of unit element chips 20, and at least some of the plurality of unit element chips 20 may be attached to the lower surface of the package substrate 100 so as to be horizontally spaced apart from the plurality of external connection terminals 150.

The package substrate 100, according to the inventive concept, includes at least two alignment patterns 122AK disposed in at least two second upper surface openings 132OP2 of the upper surface solder resist layer 132. Accordingly, the semiconductor chip 10 may be attached to the package substrate 100 using at least two second upper surface openings 132OP2 and at least two alignment patterns 122AK of the upper surface solder resist layer 132 as alignment keys.

Since the upper surface connection pad 122UP disposed in the first upper surface opening 132OP1 and the first upper surface opening 132OP1 and the alignment pattern 122AK disposed in the second upper surface opening 132OP2 and the second upper surface opening 132OP2 are formed together, when using at least two second upper surface openings 132OP2 and at least two alignment patterns 122AK as alignment keys, alignment may also be made with respect to the first upper surface opening 132OP1 and the upper surface connection pad 122UP. Therefore, in the process of attaching the semiconductor chip 10 to the package substrate 100, by using the at least two second upper surface openings 132OP2 and the at least two alignment patterns 122AK as alignment keys, it is possible to align the plurality of chip pads 16 and the plurality of upper surface connection pads 122UP, and reliability of electrical connection between the plurality of chip pads 16 and the plurality of upper surface connection pads 122UP through the plurality of chip connection members 18 may be secured.

Figure 2:
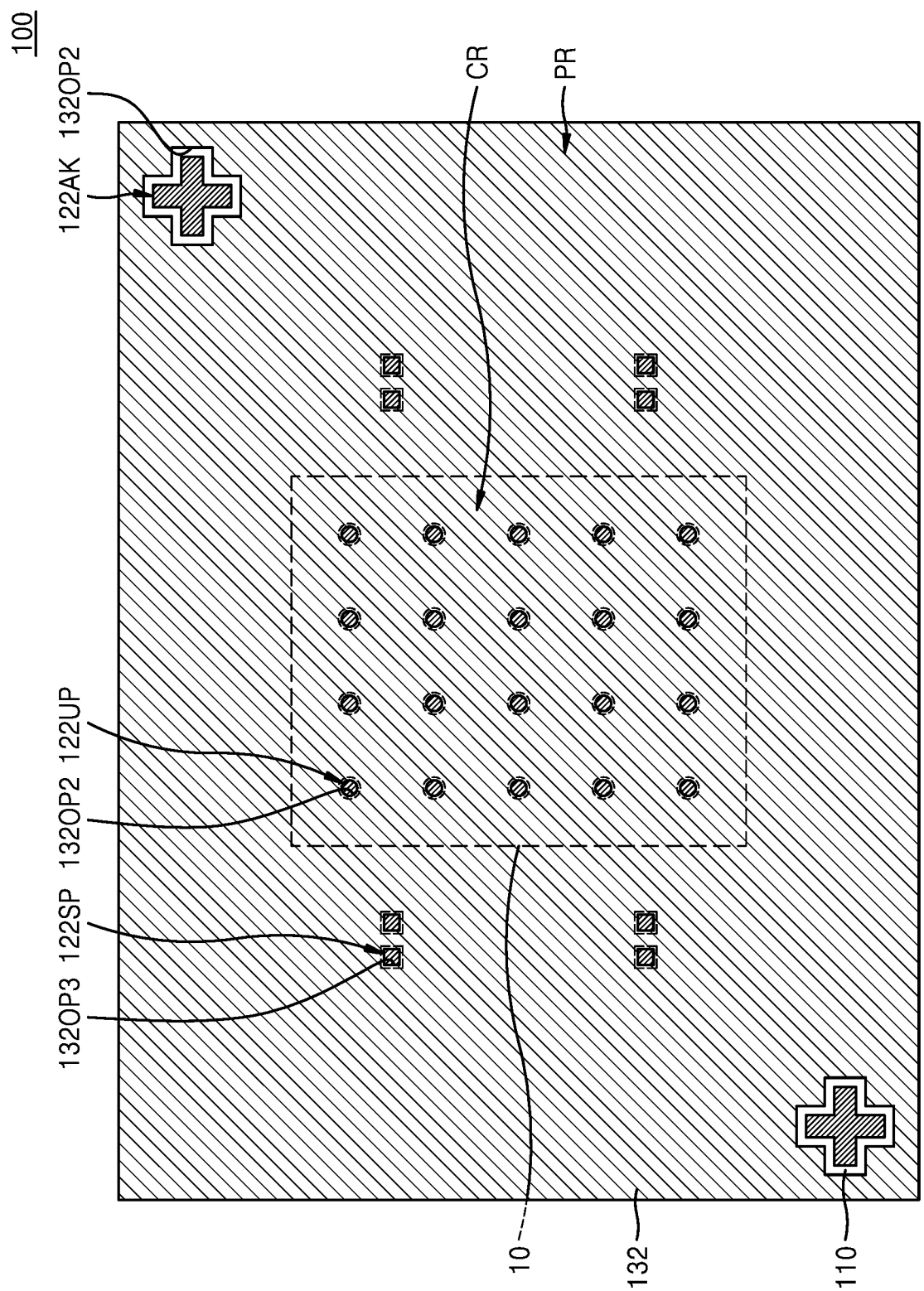
FIG. 2 is a plan view taken from above a package substrate according to the inventive concept.

FIG. 2 is a plan view taken from above the package substrate according to the inventive concept.

Referring to FIG. 2, the package substrate 100 may include a chip attachment region CR, on which the semiconductor chip 10 is disposed, and a peripheral region PR, on which the semiconductor chip 10 is not attached. In the plan view, the peripheral region PR may enclose the perimeter of the chip attachment region CR. In the vertical direction, the chip attachment region CR may overlap the semiconductor chip 10, and the peripheral region PR might not overlap the semiconductor chip 10. At least two alignment patterns 122AK may be disposed in the peripheral region PR. Each of the at least two alignment patterns 122AK may be disposed adjacent to the edge of the package substrate 100, in a plan view, for example, the edge of the upper surface of the at least one substrate base 110. For example, the two alignment patterns 122AK may be disposed adjacent to two edges of the package substrate 100 corresponding to each other in a diagonal direction, in a plan view. At least two element connection pads 122SP may be disposed in the peripheral region PR, but this arrangement is not necessarily limited thereto. In some embodiments, the at least two element connection pads 122SP may be disposed adjacent to the chip attachment region CR, in the plan view, rather than the at least two alignment patterns 122AK. For example, at least two element connection pads 122SP may be disposed farther from the edge of the package substrate 100 than the at least two alignment patterns 122AK.

The plurality of upper surface connection pads 122UP may be disposed in the chip attachment region CR. For example, each of the plurality of upper surface connection pads 122UP may overlap the semiconductor chip 10 in the vertical direction.

The upper surface solder resist layer 132 may have a plurality of first upper surface openings 132OP1, at least two second upper surface openings 132OP2, and at least two third upper surface openings 132OP3, which extend from the upper surface to the lower surface of the upper surface solder resist layer 132. A plurality of upper surface connection pads 122UP may be disposed in the plurality of first upper surface openings 132OP1. At least two alignment patterns 122AK may be disposed in the at least two second upper surface openings 132OP2. At least two element connection pads 122SP may be disposed in the at least two third upper surface openings 132OP3. A portion of the upper surface of at least one substrate base 110 in the plurality of first upper surface openings 132OP1 may be fully covered by the plurality of upper surface connection pads 122UP. A portion of the upper surface of the at least one substrate base 110 in the at least two second upper surface openings 132OP2 may be covered by the at least two alignment patterns 122AK, and the remaining portion may be uncovered and exposed. The upper surface solder resist layer 132 may be spaced apart from at least two alignment patterns 122AK. A portion of the upper surface of the at least one substrate base 110 may be exposed between the upper surface solder resist layer 132 and the at least two alignment patterns 122AK spaced apart from each other. A portion of the upper surface of at least one substrate base 110 in the at least two third upper surface openings 132OP3 may be fully covered by at least two element connection pads 122SP.

In some embodiments, each of the first upper surface opening 132OP1 and the upper surface connection pad 122UP may have a shape, in a plan view, that does not have a vertex, and each of the second upper surface opening 132OP2 and the alignment pattern 122AK may have a shape, in a plan view, having angled vertices. For example, each of the first upper surface opening 132OP1 and the upper surface connection pad 122UP may have a circular or elliptical shape, in a plan view. For example, each of the second upper surface opening 132OP2 and the alignment pattern 122AK may have a shape, in a plan view, such as polygons such as triangles and squares, an L-shape with thickness or width in the horizontal direction, a + (cross) shape with thickness or width in the horizontal direction, a ring shape with vertices with refracted angles, and the like. In FIG. 2, each of the third upper surface opening 132OP3 and the element connection pad 122SP is illustrated as having a rectangular shape, in a plan view, but this is not necessarily limited thereto. For example, each of the third upper surface opening 132OP3 and the element connection pad 122SP may have a circular or elliptical shape, in a plan view.

A horizontal width of the first upper surface opening 132OP1 may be less than a horizontal width of the second upper surface opening 132OP2. A horizontal width of the third upper surface opening 132OP3 may be less than a horizontal width of the second upper surface opening 132OP2. A horizontal width of the third upper surface opening 132OP3 may be substantially equal to a horizontal width of the first upper surface opening 132OP1 or may greater than a horizontal width of the first upper surface opening 132OP1. In some embodiments, the horizontal width of the second upper surface opening 132OP2 may have a relatively wide portion and a relatively narrow portion, and each of a relatively wide portion and a relatively narrow portion of the horizontal width of the second upper surface opening 132OP2 may be greater than a horizontal width of the first upper surface opening 132OP1.

The horizontal width of the upper surface connection pad 122UP may less than the horizontal width of the alignment pattern 122AK. The horizontal width of the element connection pad 122SP may be less than the horizontal width of the alignment pattern 122AK. The horizontal width of the element connection pad 122SP may be substantially equal to the horizontal width of the upper surface connection pad 122UP or may be greater than the horizontal width of the upper surface connection pad 122UP. In some embodiments, the horizontal width of the alignment pattern 122AK may have a relatively wide portion and a relatively narrow portion, and each of a relatively wide portion and a relatively narrow portion of the horizontal width of the alignment pattern 122AK may be greater than the horizontal width of the upper surface connection pad 122UP.

Figure 3:
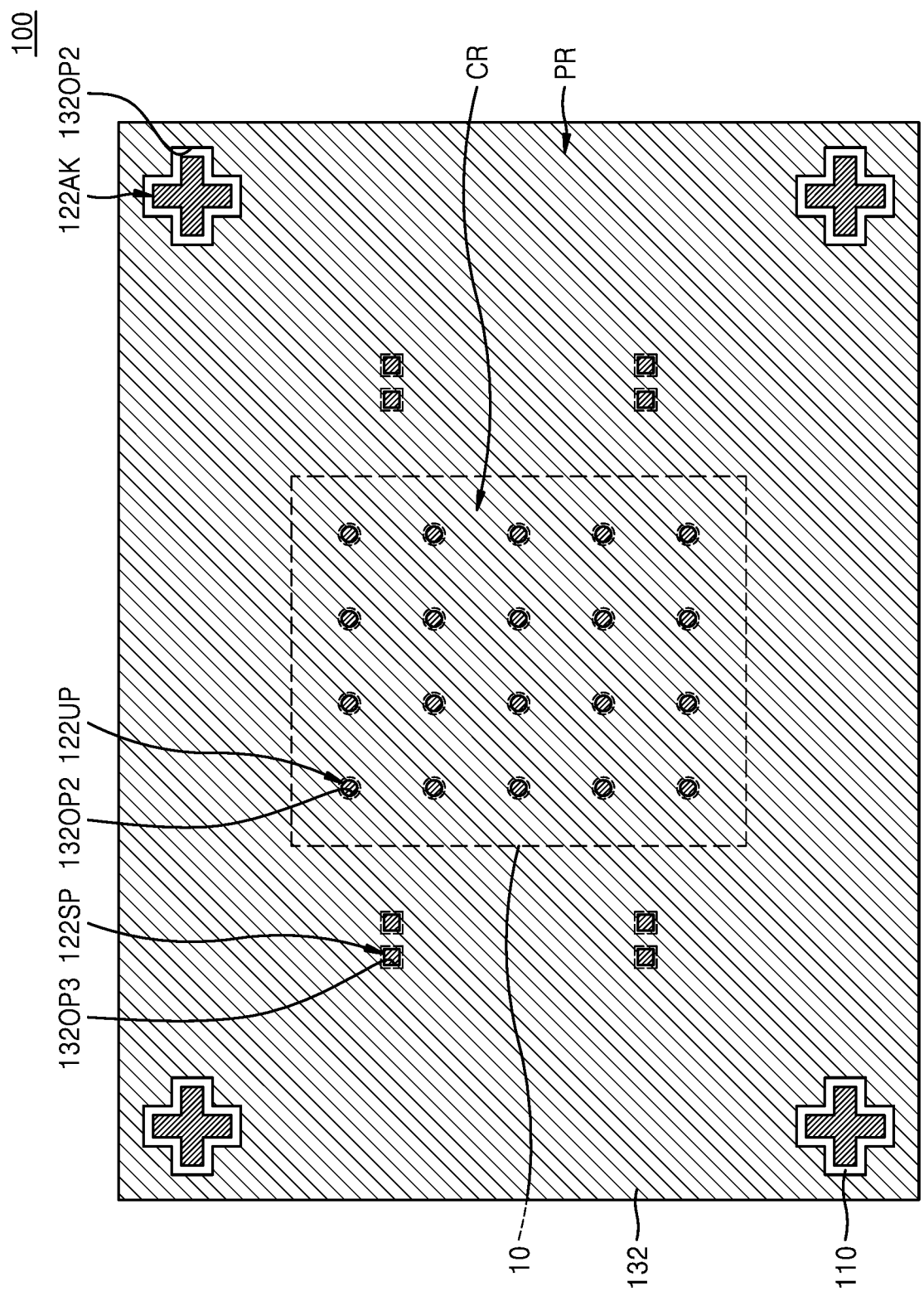
FIG. 3 is a plan view taken from above a package substrate according to the inventive concept.

FIG. 3 is a plan view taken from above the package substrate according to the inventive concept.

Referring to FIG. 3, the package substrate 100 may include a chip attachment region CR on which the semiconductor chip 10 is disposed and a peripheral region PR on which the semiconductor chip 10 is not attached. In the vertical direction, the chip attachment region CR may overlap the semiconductor chip 10, and the peripheral region PR might not overlap the semiconductor chip 10. The plurality of upper surface connection pads 122UP may be disposed in the chip attachment region CR.

At least four alignment patterns 122AK may be disposed in the peripheral region PR. Each of the at least four alignment patterns 122AK may be disposed adjacent to the edge of the package substrate 100 in a plan view. For example, the four alignment patterns 122AK may be disposed adjacent to the four edges of the package substrate 100 in the plan view. At least two element connection pads 122SP may be disposed in the peripheral region PR, but the current arrangement is not necessarily limited thereto. In some embodiments, the at least two element connection pads 122SP may be adjacent to the chip attachment region CR, in the plan view, rather than the at least four alignment patterns 122AK. For example, at least two element connection pads 122SP may be disposed farther from the edge of the package substrate 100 than the at least four alignment patterns 122AK, in the plan view.

The upper surface solder resist layer 132 may have a plurality of first upper surface openings 132OP1, at least four second upper surface openings 132OP2, and at least two third upper surface openings 132OP3, which extend from the upper surface to the lower surface of the upper surface solder resist layer 132. A plurality of upper surface connection pads 122UP may be disposed in the plurality of first upper surface openings 132OP1. At least four alignment patterns 122AK may be disposed in the at least four third upper surface openings 132OP2. At least two element connection pads 122SP may be disposed in the at least two third upper surface openings 132OP3. A portion of the upper surface of at least one substrate base 110 in the plurality of first upper surface openings 132OP1 may be fully covered by the plurality of upper surface connection pads 122UP. A portion of the upper surface of the at least one substrate base 110 in the at least four second upper surface openings 132OP2 may be covered by the at least two alignment patterns 122AK, and the remaining portion may be uncovered and exposed. The upper surface solder resist layer 132 may be spaced apart from at least four alignment patterns 122AK. A portion of the upper surface of the at least one substrate base 110 may be exposed between the upper surface solder resist layer 132 and the at least four alignment patterns 122AK spaced apart from each other. A portion of the upper surface of at least one substrate base 110 in the at least two third upper surface openings 132OP3 may be fully covered by at least two element connection pads 122SP.

In some embodiments, each of the first upper surface opening 132OP1 and the upper surface connection pad 122UP may have a shape, in a plan view, that does not have a vertex, and each of the second upper surface opening 132OP2 and the alignment pattern 122AK may have a shape, in the plan view, having angled vertices. For example, each of the first upper surface opening 132OP1 and the upper surface connection pad 122UP may have a circular or elliptical shape, in a plan view. For example, each of the second upper surface opening 132OP2 and the alignment pattern 122AK may have a shape, in the plan view, such as polygons including rectangles, an L-shape with thickness or width in the horizontal direction, a + shape with thickness or width in the horizontal direction, a ring shape with vertices with refracted angles, and the like.

A horizontal width of the first upper surface opening 132OP1 may be less than a horizontal width of the second upper surface opening 132OP2. A horizontal width of the third upper surface opening 132OP3 may be less than a horizontal width of the second upper surface opening 132OP2. The horizontal width of the upper surface connection pad 122UP may less than the horizontal width of the alignment pattern 122AK. The horizontal width of the element connection pad 122SP may be less than the horizontal width of the alignment pattern 122AK.

Figure 4A:
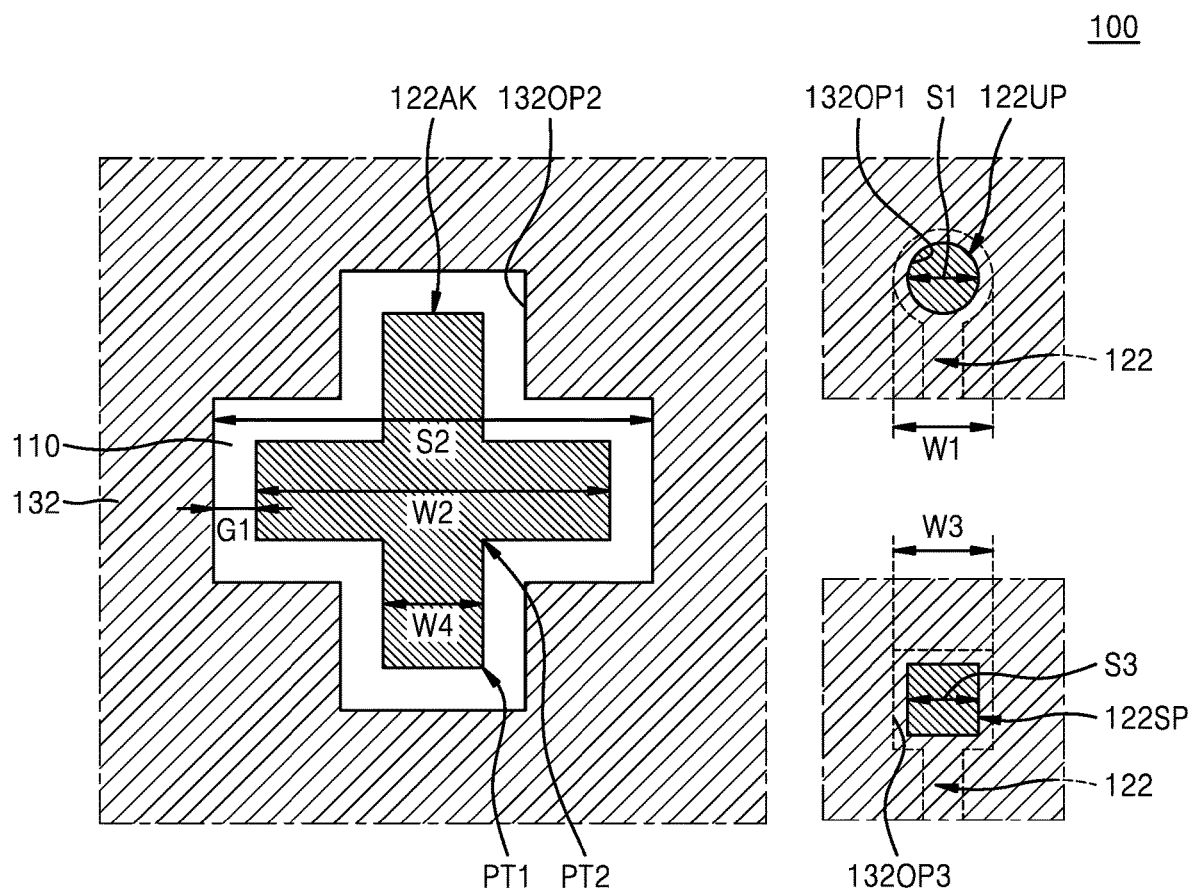
FIG. 4A is an enlarged plan view taken from above part of a package substrate according to the inventive concept.
Figure 4B:
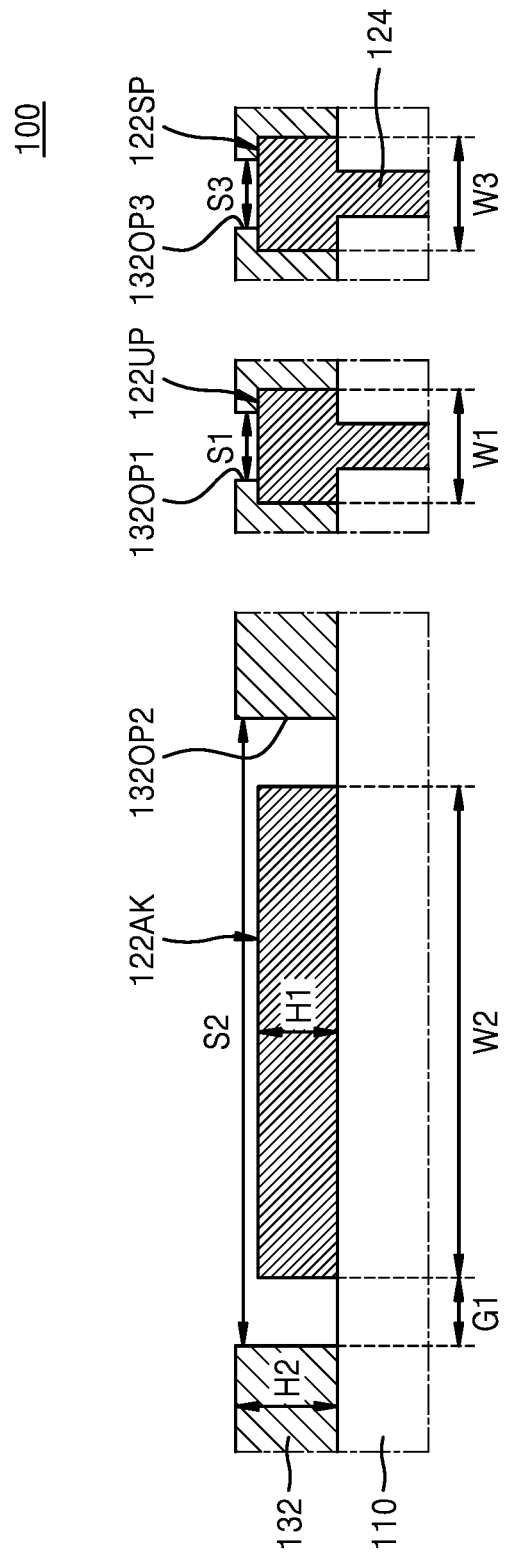
FIG. 4B is a cross-sectional view showing part of a package substrate according to the inventive concept.

FIG. 4A is an enlarged plan view of a part of the package substrate according to the inventive concept, and FIG. 4B is a cross-sectional view showing a part of the package substrate according to the inventive concept.

Referring to FIGS. 4A and 4B together, the upper surface solder resist layer 132 of the package substrate 100 may have a first upper surface opening 132OP1, a second upper surface opening 132OP2, and a third upper surface opening 132OP3, which extend from the upper surface to the lower surface of the upper surface solder resist layer 132. An upper surface connection pad 122UP may be disposed in the first upper surface opening 132OP1. An alignment pattern 122AK may be disposed in the second upper surface opening 132OP2. An element connection pad 122SP may be disposed in the third upper surface opening 132OP3. A portion of the upper surface of at least one substrate base 110 in the first upper surface opening 132OP1 may be fully covered by the upper surface connection pad 122UP. A portion of the upper surface of at least one substrate base 110 in the third upper surface opening 132OP3 may be fully covered by the element connection pad 122SP.

A portion of the upper surface of the at least one substrate base 110 in the second upper surface opening 132OP2 may be covered by the alignment pattern 122AK, and the remaining portion may be uncovered and exposed. The upper surface solder resist layer 132 may be spaced apart from the alignment pattern 122AK. For example, the side surface of the upper surface solder resist layer 132 and the side surface of the alignment pattern 122AK defining the second upper surface opening 132OP2 may be spaced apart from each other by the first interval G1 in the horizontal direction. The first interval G1 may be, for example, about 25 μm to about 75 μm. A portion of the upper surface of the at least one substrate base 110 may be exposed between the upper surface solder resist layer 132 and the alignment pattern 122AK spaced apart from each other.

In some embodiments, the upper surface solder resist layer 132 may cover an edge portion of the upper surface of the upper surface connection pad 122UP, and the upper surface solder resist layer 132 might not cover the remaining middle portion. In some embodiments, the upper surface solder resist layer 132 may cover an edge portion of the upper surface of the device pad 122SP, and the upper surface solder resist layer 132 might not cover the remaining middle portion.

In some embodiments, each of the first upper surface opening 132OP1 and the upper surface connection pad 122UP may have a shape, in a plan view, that does not have a vertex, and each of the second upper surface opening 132OP2 and the alignment pattern 122AK may have a shape, in a plan view, having vertices. For example, each of the first upper surface opening 132OP1 and the upper surface connection pad 122UP may have a circular or elliptical shape, in a plan view. For example, each of the second upper surface opening 132OP2 and the alignment pattern 122AK may have a +-shape, in a plan view, having a particular thickness, for example, a width in a horizontal direction. In FIG. 4A, each of the third upper surface opening 132OP3 and the element connection pad 122SP is illustrated as having a rectangular shape, in a plan view, but the disclosure is not necessarily limited thereto. For example, each of the third upper surface opening 132OP3 and the element connection pad 122SP may have a circular or elliptical shape, in a plan view.

For example, the alignment pattern 122AK may have at least three vertices. In some embodiments, the alignment pattern 122AK may have a convex vertex PT1 or may have a convex vertex PT1 and a concave vertex PT2 together. For example, the alignment pattern 122AK may have eight convex vertices PT1 and four concave vertices PT2.

The first opening width S1, which is the horizontal width of the first upper surface opening 132OP1, may be less than the second opening width S2, which is the horizontal width of the second upper surface opening 132OP2. In some embodiments, the second opening width S2 may be 5 times or more greater than the first opening width S1. The third opening width S3, which is the horizontal width of the third upper surface opening 132OP3, may be less than the second opening width S2. The third opening width S3 may be substantially equal to the width of the first opening S1 or may be greater than the first opening width S1. For example, the first opening width S1 may be about 50 µm to about 150 µm. For example, the second opening width S2 may be about 250 µm to about 1000 µm.

In some embodiments, the second upper surface opening 132OP2 may have a relatively wide portion and a relatively narrow portion of the horizontal width, and each of the relatively wide portion and the relatively narrow portion of the second upper surface opening 132OP2 may be greater than the first opening width S1. For example, in the second upper surface openings 132OP2, a portion having a relatively wide horizontal width may have a second opening width S2 of about 500 µm to about 1000 µm and a portion having a relatively narrow horizontal width may have a second opening width S2 of about 250 µm to about 500 µm.

The first horizontal width W1 that is the horizontal width of the upper surface connection pad 122UP may be less than the second horizontal width W2 that is the maximum horizontal width of the alignment pattern 122AK. The third horizontal width W3, which is the horizontal width of the element connection pad 122SP, may be less than the second horizontal width W2. The third horizontal width W3 may be substantially equal to the first horizontal width W1 or may be greater than the first horizontal width W1. In some embodiments, the horizontal width of the alignment pattern 122AK may have a relatively wide portion and a relatively narrow portion, and a portion of the alignment pattern 122AK having a relatively wide horizontal width may have a second horizontal width W2, and a relatively narrow portion may have a fourth horizontal width W4. The second horizontal width W2 may be a width in the longitudinal direction of two +-shaped extension lines, and the fourth horizontal width W4 may be a width in a direction orthogonal to the two +-shaped extension lines. The fourth horizontal width W4 may be greater than the first opening width S1.

The first horizontal width W1 may be equal to or greater than the first opening width S1. For example, the first horizontal width W1 may be about 50 µm to about 160 µm. For example, each of the first horizontal width W1 and the first opening width S1 may be greater than the first interval G1. The third horizontal width W3 may be greater than the third opening width S3. The second horizontal width W2 may be about 300 µm to about 900 µm, and the fourth horizontal width W4 may be about 60 µm to about 400 µm.

The upper surface of the upper surface solder resist layer 132 may be positioned at a vertical level that is higher than the upper surface of each of the upper surface connection pad 122UP, the alignment pattern 122AK, and the element connection pad 122SP. In some embodiments, each of the upper surface connection pad 122UP, the alignment pattern 122AK, and the element connection pad 122SP may have a first thickness H1, and the upper surface solder resist layer 132 has a second thickness H2 that is greater than the first thickness H1 and may cover the upper surface of at least one substrate base 110. For example, the first thickness H1 may be about 10 µm to about 20 µm, and the second thickness H2 may be about 11 µm to about 30 µm.

Although FIG. 4B illustrates that the upper surface solder resist layer 132 has an upper surface positioned at the same vertical level, the inventive concept is not necessarily limited thereto. For example, the upper surface of the portion covering the upper surface of each of the upper surface connection pad 122UP and the element connection pad 122SP of the upper surface solder resist layer 132 and the portion adjacent to the side surface may be positioned at a higher vertical level than the upper surface of the portion covering the upper surface of the at least one substrate base 110.

FIGS. 5A to 5E are enlarged plan views taken from above a portion of the package substrate, according to the inventive concept.

Figure 5A:
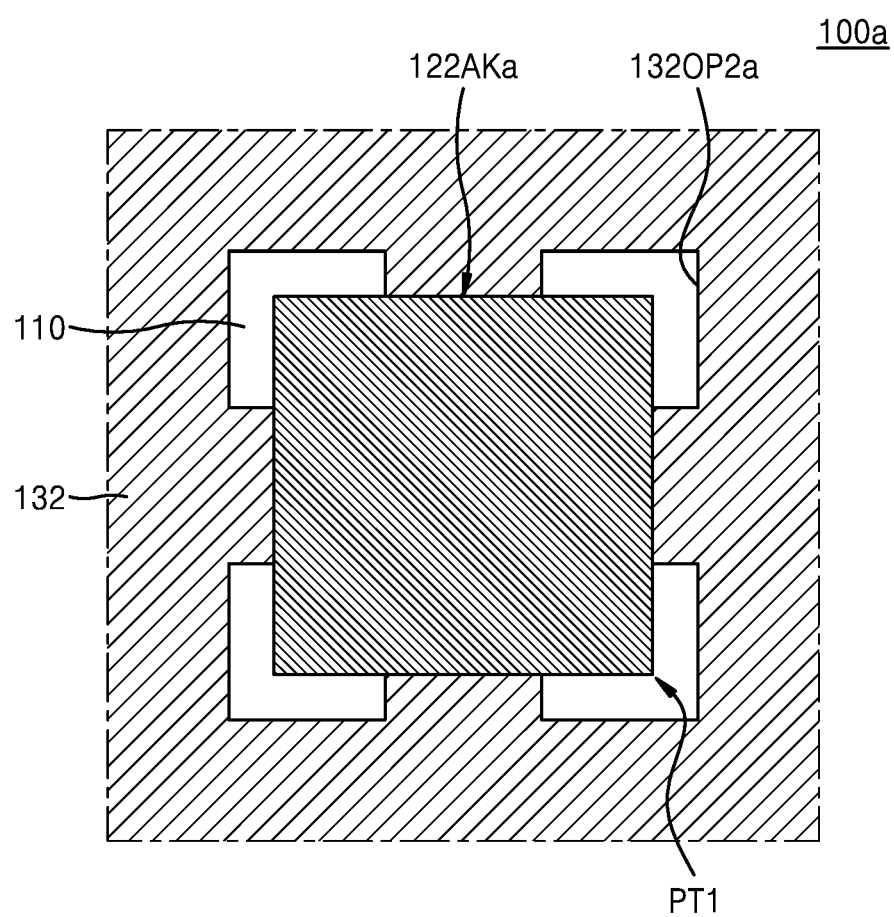
FIGS. 5A to 5E are enlarged plan views taken from above part of a package substrate, according to the inventive concept.

Referring to FIG. 5A, the upper surface solder resist layer 132 of the package substrate 100a may have a second upper surface opening 132OP2a extending from the upper surface to the lower surface of the upper surface solder resist layer 132. An alignment pattern 122AKa may be disposed in the second upper surface opening 132OP2a. A portion of the upper surface of the at least one substrate base 110 in the second upper surface opening 132OP2a may be covered by the alignment pattern 122AKa, and the remaining portion may be uncovered and exposed. A portion of the side surface of the upper surface solder resist layer 132 defining the second upper surface opening 132OP2a may be spaced apart from the side surface of the alignment pattern 122AKa, and the remaining portion may be in contact with the side surface of the alignment pattern 122AKa. A portion of the upper surface of the at least one substrate base 110 may be externally exposed between a portion of the side surface of the upper surface solder resist layer 132 and the alignment pattern 122AKa spaced apart from each other.

Each of the second upper surface opening 132OP2a and the alignment pattern 122AKa may have a shape with vertices, in a plan view. For example, the alignment pattern 122AKa may have a rectangular shape, in a plan view. The side surface of the upper surface solder resist layer 132 defining the second upper surface opening 132OP2a may be spaced apart from a portion adjacent to the edge of the alignment pattern 122AKa, and may be in contact with a portion of a side surface of the alignment pattern 122AKa that is spaced apart from the edge of the alignment pattern 122AKa. A portion of the upper surface of the at least one substrate base 110 exposed between a side surface of the upper surface solder resist layer 132 defining the second upper surface opening 132OP2*a* and a portion adjacent to the edge of the alignment pattern 122AKa may have an L-shape, in a plan view, having a particular width.

For example, the alignment pattern 122AKa may have four vertices. In some embodiments, the alignment pattern 122AKa may have four convex vertices PT1.

Figure 5B:
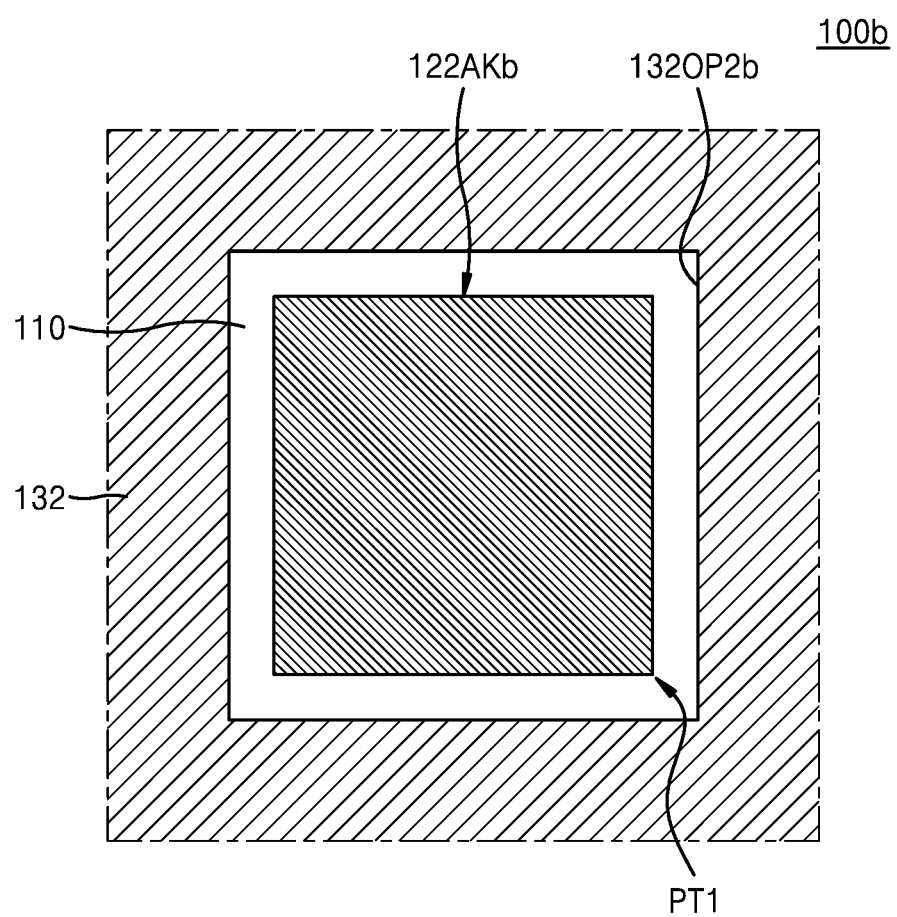

Referring to FIG. 5B, the upper surface solder resist layer 132 of the package substrate 100*b* may have a second upper surface opening 132OP2*b* extending from the upper surface to the lower surface of the upper surface solder resist layer 132. An alignment pattern 122AKb may be disposed in the second upper surface opening 132OP2*b*. A portion of the upper surface of the at least one substrate base 110 in the second upper surface opening 132OP2*b* may be covered by the alignment pattern 122AKb, and the remaining portion may be uncovered and exposed. A side surface of the upper surface solder resist layer 132 defining the second upper surface opening 132OP2*b* may be spaced apart from a side surface of the alignment pattern 122AKb. A portion of the upper surface of the at least one substrate base 110 may be externally exposed between the side surface of the upper surface solder resist layer 132 and the alignment pattern 122AKb spaced apart from each other.

Each of the second upper surface opening 132OP2*b* and the alignment pattern 122AKb may have a shape, in a plan view, with vertices. For example, each of the second upper surface opening 132OP2*b* and the alignment pattern 122AKb may have a rectangular shape, in a plan view. A portion of the upper surface of the at least one substrate base 110 exposed between a side surface of the upper surface solder resist layer 132 defining the second upper surface opening 132OP2*b* and a portion adjacent to the edge of the alignment pattern 122AKb may be refracted to have a ring-shape, in a plan view, with vertices.

For example, the alignment pattern 122AKb may have four vertices. In some embodiments, the alignment pattern 122AKb may have four convex vertices PT1.

Figure 5C:
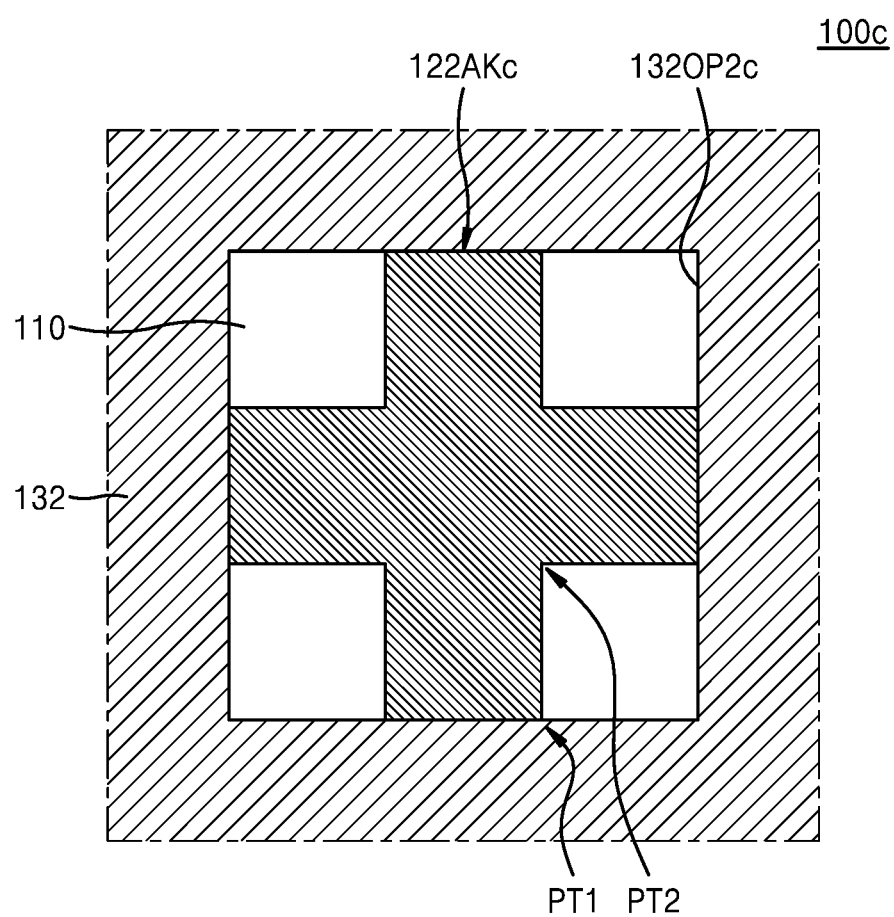

Referring to FIG. 5C, the upper surface solder resist layer 132 of the package substrate 100*c* may have a second upper surface opening 132OP2*c* extending from the upper surface to the lower surface of the upper surface solder resist layer 132. An alignment pattern 122AKc may be disposed in the second upper surface opening 132OP2*c*. A portion of the upper surface of the at least one substrate base 110 in the second upper surface opening 132OP2*c* may be covered by the alignment pattern 122AKc, and the remaining portion may be uncovered and exposed. A portion of the side surface of the upper surface solder resist layer 132 defining the second upper surface opening 132OP2*c* may be spaced apart from the side surface of the alignment pattern 122AKc, and the remaining portion may be in contact with the side surface of the alignment pattern 122AKc. A portion of the upper surface of the at least one substrate base 110 may be externally exposed between a portion of the side surface of the upper surface solder resist layer 132 and the alignment pattern 122AKc spaced apart from each other.

Each of the second upper surface opening 132OP2*c* and the alignment pattern 122AKc may have a shape, in a plan view, with vertices. For example, the second upper surface opening 132OP2*c* may have a rectangular shape, in a plan view. For example, the alignment pattern 122AKa may have a +-shape, in a plan view, having a particular width. The side surface of the upper surface solder resist layer 132 defining the second upper surface opening 132OP2*c* may be in contact with both ends of each of two +-shaped extension lines of the alignment pattern 122AKb, and may be spaced apart from the side surface of each of the two extension lines of the + shape. A portion of the upper surface of the at least one substrate base 110 exposed between a side surface of the upper surface solder resist layer 132 defining the second upper surface opening 132OP2*c* and a side surface of the alignment pattern 122AKc may have a rectangular shape, in a plan view. For example, the alignment pattern 122AK may have eight convex vertices PT1 and four concave vertices PT2.

Figure 5D:
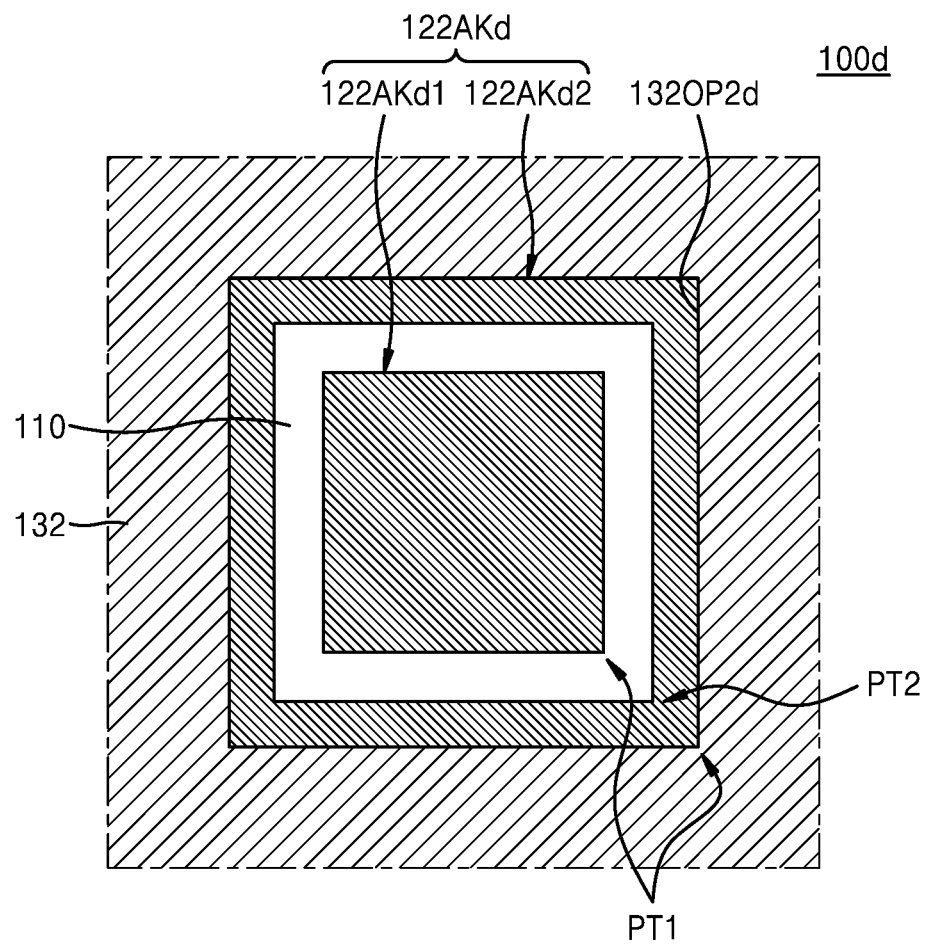

Referring to FIG. 5D, the upper surface solder resist layer 132 of the package substrate 100*d* may have a second upper surface opening 132OP2*d* extending from the upper surface to the lower surface of the upper surface solder resist layer 132. An alignment pattern 122AKd may be disposed in the second upper surface opening 132OP2*d*. A portion of the upper surface of the at least one substrate base 110 in the second upper surface opening 132OP2*d* may be covered by the alignment pattern 122AKd, and the remaining portion may be uncovered and exposed.

The alignment pattern 122AKd may include a first portion 122AKd1 and a second portion 122AKd2 that are spaced apart from each other. Each of the second upper surface opening 132OP2*d* and the first and second portions 122AKd1 and 122AKd2 of the alignment pattern 122AKd may have a shape, in a plan view, with vertices. For example, the second upper surface opening 132OP2*d* and the first portion 122AKd1 of the alignment pattern 122AKd may have a rectangular shape, in a plan view, and the second portion 122AKd2 of the alignment pattern 122AKd may be refracted to have a ring-shape, in a plan view, with vertices. The second portion 122AKd2 of the alignment pattern 122AKd may be spaced apart from the first portion 122AKd1 and surround the first portion 122AKd1.

A side surface of the upper surface solder resist layer 132 defining the second upper surface opening 132OP2*d* and an outer surface of the second portion 122AKd2 of the alignment pattern 122AKd may contact each other. A portion of the upper surface of the at least one substrate base 110 may be externally exposed between the inner surface of the second portion 122AKd2 of the alignment pattern 122AKd and the side surface of the first portion 122AKd1. A portion of the upper surface of the at least one substrate base 110 exposed between the inner surface of the second portion 122AKd2 of the alignment pattern 122AKd and the side surface of the first portion 122AKd1 may be refracted to have a ring-shape, in a plan view, with vertices.

For example, the first portion 122AKd1 of the alignment pattern 122AKd may have four convex vertices PT1, and the second portion 122AKd2 may have four convex vertices PT1 and four concave vertices PT2.

Figure 5E:
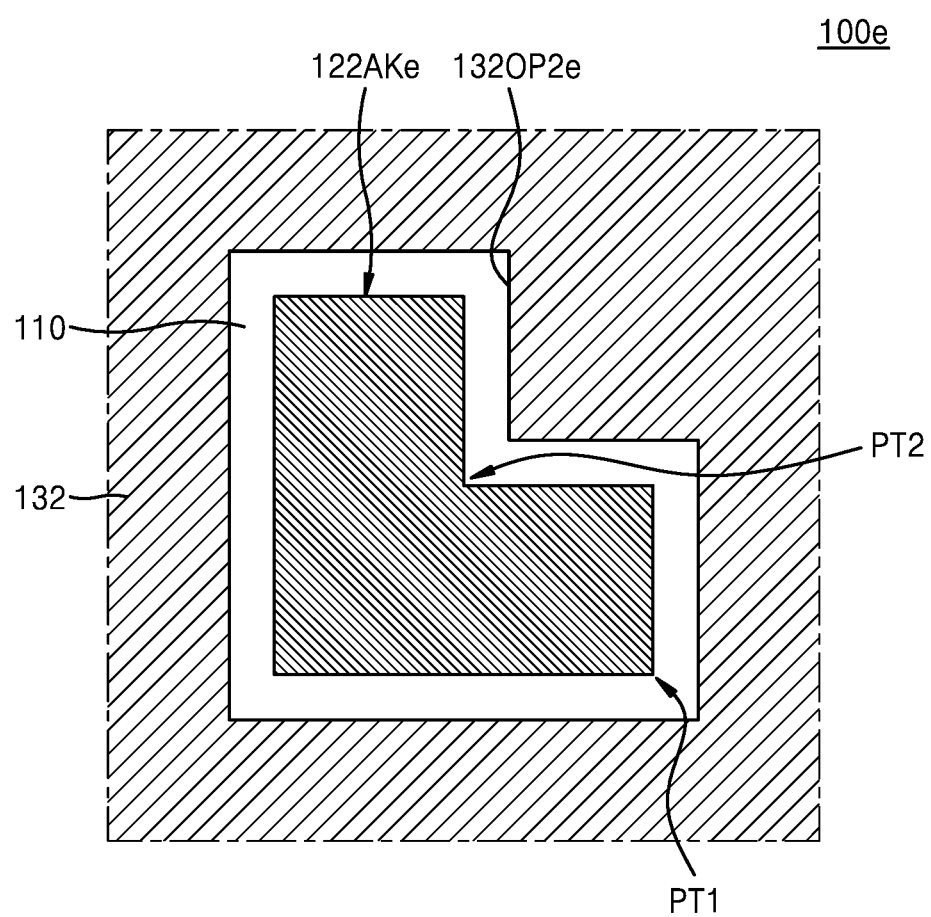

Referring to FIG. 5E, the upper surface solder resist layer 132 of the package substrate 100*e* may have a second upper surface opening 132OP2*e* extending from the upper surface to the lower surface of the upper surface solder resist layer 132. An alignment pattern 122AKe may be disposed in the second upper surface opening 132OP2*e*. A portion of the upper surface of the at least one substrate base 110 in the second upper surface opening 132OP2*e* may be covered by the alignment pattern 122AKe, and the remaining portion may be uncovered and exposed. A side surface of the upper surface solder resist layer 132 defining the second upper surface opening 132OP2*e* may be spaced apart from a side surface of the alignment pattern 122AKe. A portion of the upper surface of the at least one substrate base 110 may be externally exposed between the side surface of the upper surface solder resist layer 132 and the alignment pattern 122AKe spaced apart from each other.

Each of the second upper surface opening 132OP2e and the alignment pattern 122AKe may have a shape, in a plan view, with vertices. For example, each of the second upper surface opening 132OP2e and the alignment pattern 122AKe may have an L-shape, in a plan view, having a particular width. A portion of the upper surface of the at least one substrate base 110 exposed between a side surface of the upper surface solder resist layer 132 defining the second upper surface opening 132OP2e and a portion adjacent to the edge of the alignment pattern 122AKe may be refracted to have vertices and surround the alignment pattern 122AKe.

For example, the alignment pattern 122AKe may have five convex vertices PT1 and one concave vertex PT2.

FIGS. 6A to 6E are cross-sectional views illustrating a package substrate and a method of manufacturing a semiconductor package including the package substrate according to the inventive concept.

Figure 6A:
FIGS. 6A to 6E are cross-sectional views illustrating a package substrate and a method of manufacturing a semiconductor package including a package substrate, according to the inventive concept.

Referring to FIG. 6A, at least one substrate base 110 and a substrate wiring structure 120 including and a plurality of wiring patterns 122 disposed on the upper surface and lower surface of the substrate base 110 or disposed inside the substrate base 110 and extending in the horizontal direction, and a plurality of wiring vias 124 penetrating at least a portion of at least one substrate base 110 and extending in a vertical direction to electrically connect between two wiring patterns 122 positioned at different vertical levels among the plurality of wiring patterns 122 may be formed. In some embodiments, a plurality of stacked substrate bases 110, and a substrate wiring structure 120 including a plurality of wiring patterns 122 and a plurality of wiring vias 124 may be formed.

Figure 6B:
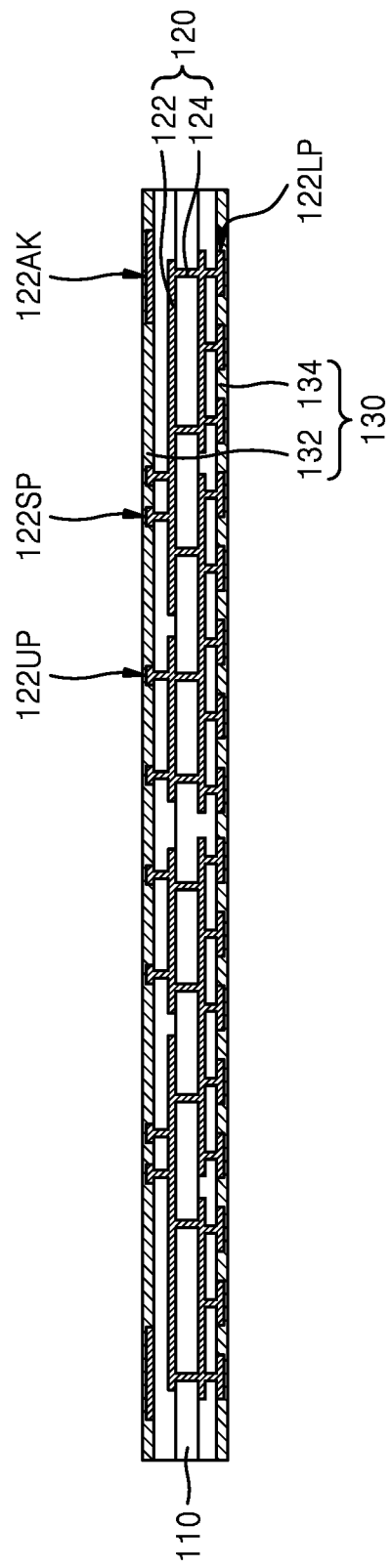

Referring to FIG. 6B, a solder resist layer 130 covering an upper surface and a lower surface of at least one substrate base 110 is formed. The upper surface solder resist layer 132 may cover the wiring patterns 122 disposed on the upper surface of at least one substrate base 110. For example, the upper surface solder resist layer 132 may cover the plurality of upper surface connection pads 122UP, at least two element connection pads 122SP, and at least two alignment patterns 122AK, which are portions of the wiring patterns 122 disposed on the upper surface of at least one substrate base 110.

The lower surface solder resist layer 134 may cover the wiring patterns 122 disposed on the lower surface of the at least one substrate base 110. For example, the lower surface solder resist layer 134 may cover the plurality of lower surface connection pads 122LP, which are portions of the wiring patterns 122 disposed on the lower surface of the at least one substrate base 110.

Figure 6C:
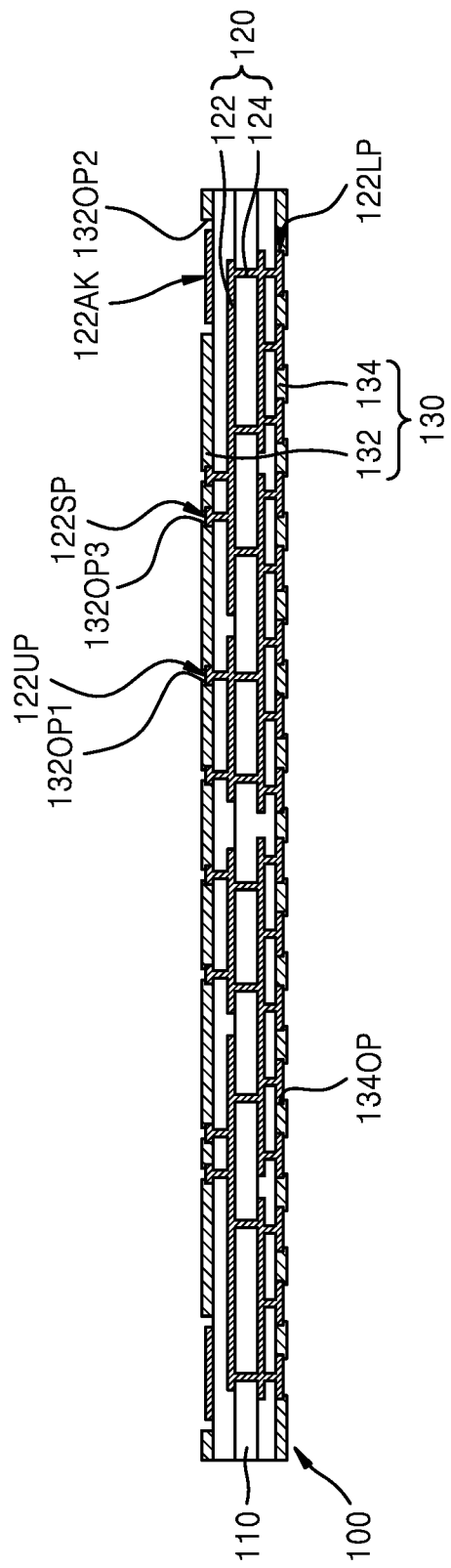

Referring to FIG. 6C, by removing a portion of the upper surface solder resist layer 132, a plurality of first upper surface openings 132OP1 extending from the upper surface to the lower surface of the upper surface solder resist layer 132, at least two second upper surface openings 132OP2, and at least two third upper surface openings 132OP3 are formed, and by removing a portion of the lower surface solder resist layer 132, a plurality of lower surface openings 134OP extending from the upper surface to the lower surface of the lower surface solder resist layer 134 is formed to form the package substrate 100.

An upper surface solder resist layer 132, having a plurality of first upper surface openings 132OP1, at least two second upper surface openings 132OP2, and at least two third upper surface openings 132OP3 may be formed not to cover portions of the wiring patterns 122 disposed on the upper surface of at least one substrate base 110. For example, an upper surface solder resist layer 132 having a plurality of first upper surface openings 132OP1, at least two second upper surface openings 132OP2, and at least two third upper surface openings 132OP3 might not cover the plurality of upper surface connection pads 122UP, at least two element connection pads 122SP, and at least two alignment patterns 122AK, which are portions of the wiring patterns 122 disposed on the upper surface of at least one substrate base 110. In some embodiments, an upper surface solder resist layer 132 having a plurality of first upper surface openings 132OP1, at least two second upper surface openings 132OP2, and at least two third upper surface openings 132OP3 might not cover upper surfaces of the plurality of upper surface connection pads 122UP and at least two element connection pads 122SP, and might not cover upper surfaces and side surfaces of at least two alignment patterns 122AK.

A plurality of upper surface connection pads 122UP may be disposed in the plurality of first upper surface openings 132OP1. At least two alignment patterns 122AK may be disposed in the at least two second upper surface openings 132OP2. At least two element connection pads 122SP may be disposed in the at least two third upper surface openings 132OP3.

A plurality of lower surface connection pads 122LP may be disposed in the plurality of lower surface openings 134OP. A portion of the lower surface of the at least one substrate base 110 in the plurality of lower surface openings 134OP may be fully covered by the plurality of lower surface connection pads 122LP.

Figure 6D:
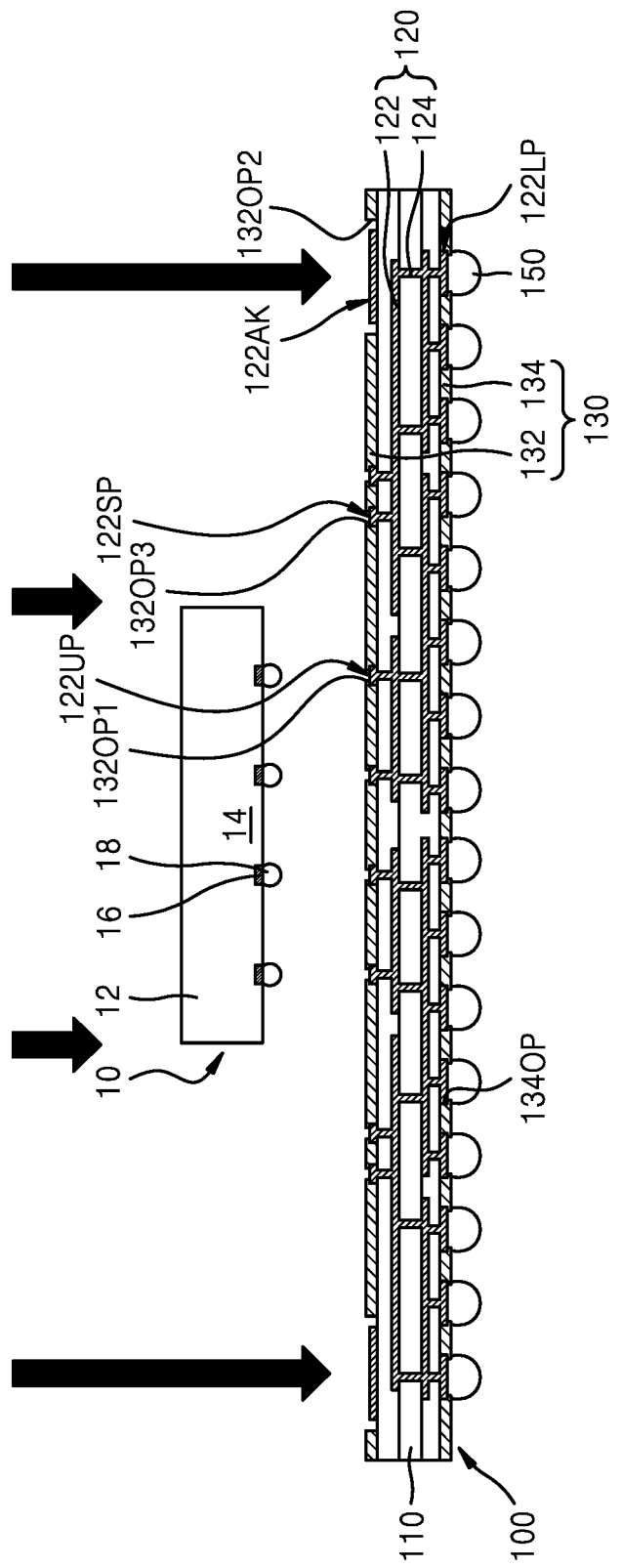
Figure 6E:
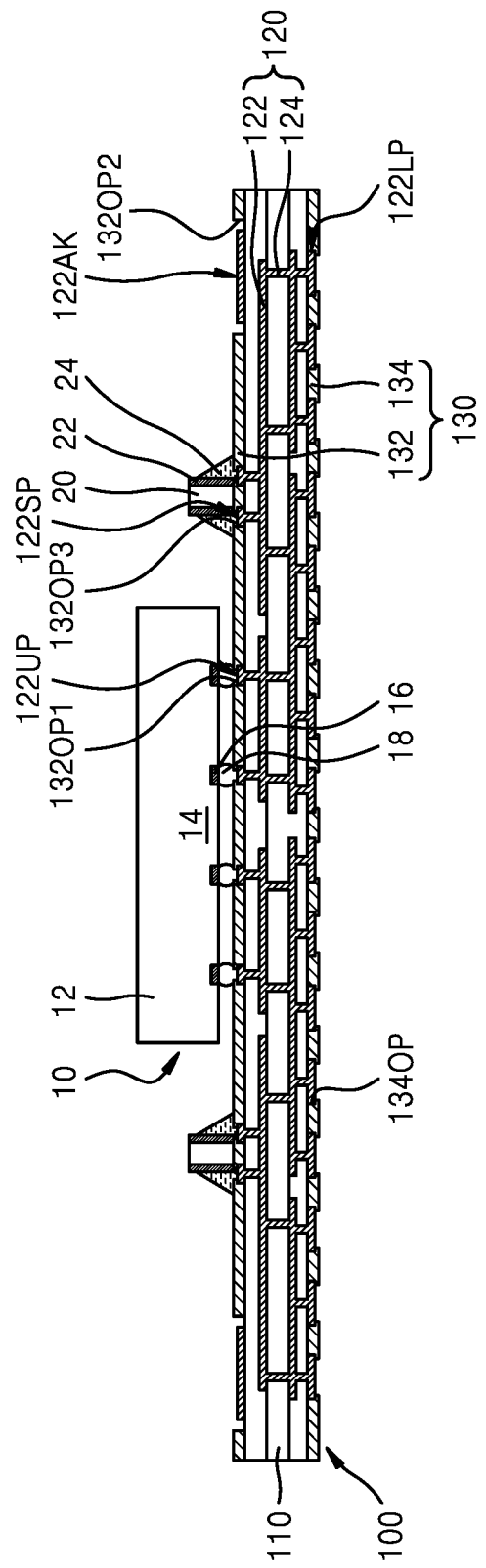

Referring to FIGS. 6D and 6E together, after preparing the semiconductor chip 10 including a semiconductor substrate 12 having an active surface and an inactive surface opposite to each other, a semiconductor element 14 formed on the active surface of the semiconductor substrate 12, and a plurality of chip pads 16 disposed on the first surface of the semiconductor chip 10 and including a plurality of chip connection members 18 attached, by using at least two second upper surface openings 132OP2 and at least two alignment patterns 122AK of the upper surface solder resist layer 132 as alignment keys, the semiconductor chip 10 may be attached to the package substrate 100. The semiconductor chip 10 has a face-down arrangement in which the first surface faces the package substrate 100, and may be attached to the upper surface of the package substrate 100.

The package substrate 100 may be manufactured as a unit package substrate corresponding to one semiconductor package, or may be provided separately as a unit package substrate before the semiconductor chip 10 is attached. For example, even when the package substrate 100 is manufactured as a strip array including a plurality of package substrates 100, after being separated from the strip array into the package substrate 100 which is a unit package substrate, the semiconductor chip 10 may be attached to the package substrate 100.

Since the upper surface connection pad 122UP disposed in the first upper surface opening 132OP1 and the first upper surface opening 132OP1 and the alignment pattern 122AK disposed in the second upper surface opening 132OP2 and the second upper surface opening 132OP2 are formed together, when using at least two second upper surface openings 132OP2 and at least two alignment patterns 122AK as alignment keys, the first upper surface opening 132OP1 and the upper surface connection pad 122UP that are covered by the semiconductor chip 10 and are not observed on the semiconductor chip 10 and the package substrate 100 may also be aligned.

Therefore, to align the plurality of chip pads 16 and the plurality of upper surface connection pads 122UP and to ensure reliability of electrical connection between the plurality of chip pads 16 and the plurality of upper surface connection pads 122UP through the plurality of chip connection members 18, the semiconductor chip 10 may be attached to the package substrate 100.

The unit element chip 20 may be attached to the upper surface of the package substrate 100 so that at least two element terminals 22 are electrically connected to at least two element connection pads 122SP. The element connection pad 122SP and the element terminal 22 may be electrically connected by an electrically conductive solder 24. In FIGS. 6D and 6E, it is illustrated that the semiconductor chip 10 is first attached to the upper surface of the package substrate 100, but the inventive concept is not necessarily limited thereto. For example, after attaching the unit element chip 20 to the upper surface of the package substrate 100 first, the semiconductor chip 10 may be attached later.

Thereafter, the semiconductor package 1 may be formed by forming an underfill layer 60 that surrounds the plurality of chip connection members 18 shown in FIG. 1 and fills the space between the semiconductor chip 10 and the package substrate 100.

Referring to FIGS. 1 to 6E, in relation to the manufacturing method of the semiconductor package 1 according to the inventive concept, the semiconductor chip 10 may be attached to the package substrate 100 using at least two second upper surface openings 132OP2 and at least two alignment patterns 122AK of the upper surface solder resist layer 132 as alignment keys. Since the upper surface connection pad 122UP disposed in the first upper surface opening 132OP1 and the first upper surface opening 132OP1 and the alignment pattern 122AK disposed in the second upper surface opening 132OP2 and the second upper surface opening 132OP2 are formed together, when using at least two second upper surface openings 132OP2 and at least two alignment patterns 122AK as alignment keys, the first upper surface opening 132OP1 and the upper surface connection pad 122UP that are covered by the semiconductor chip 10 and are not observed on the semiconductor chip 10 and the package substrate 100 may also be aligned. For example, since the first interval G1 between the second upper surface opening 132OP2 and the alignment pattern 122AK is less than the first horizontal width W1, when using at least two second upper surface openings 132OP2 and at least two alignment patterns 122AK as alignment keys, alignment accuracy between the plurality of chip pads 16 and the plurality of upper surface connection pads 122UP may be increased.

Therefore, to align the plurality of chip pads 16 and the plurality of upper surface connection pads 122UP and to ensure reliability of electrical connection between the plurality of chip pads 16 and the plurality of upper surface connection pads 122UP through the plurality of chip connection members 18, the semiconductor chip 10 may be attached to the package substrate 100.

Figure 7:
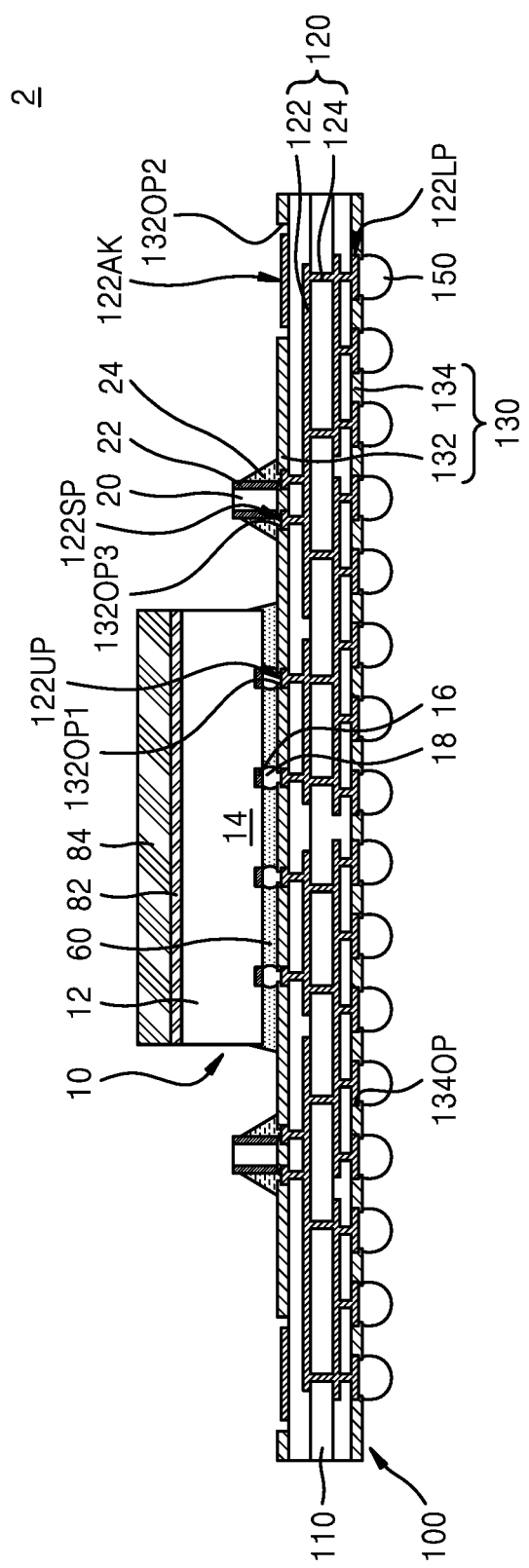
FIG. 7 is a cross-sectional view showing a semiconductor package including a package substrate according to the inventive concept.

FIG. 7 is a cross-sectional view showing a semiconductor package including a package substrate according to the inventive concept. Among the contents of FIG. 7, to the extent that an element has not been described in detail, it may be assumed that the element is at least similar to a corresponding element that has been described with reference to FIGS. 1 to 6E.

Referring to FIG. 7, the semiconductor package 2 includes a heat dissipation member 84 attached to the upper surface (e.g., the second surface) of the semiconductor chip 10 with a thermal interface material (TIM) layer 82 arranged therebetween.

The TIM layer 82 may be made of an insulating material or a material capable of maintaining electrical insulation and including an insulating material. The TIM layer 82 may include, for example, an epoxy resin. The TIM layer 82 may be, for example, mineral oil, grease, gap filler putty, phase change gel, phase change material pads. or a particle filled epoxy.

The heat dissipation member 84 may be, for example, a heat sink, a heat spreader, a heat pipe, or a liquid cooled cold plate.

Figure 8:
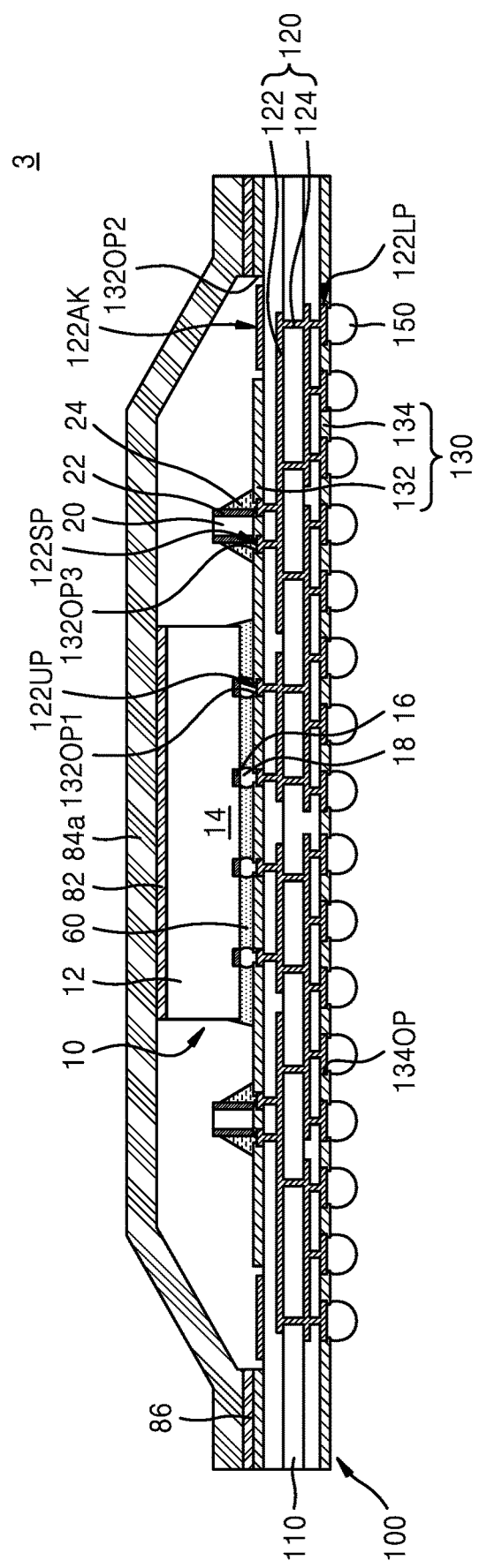
FIG. 8 is a cross-sectional view showing a semiconductor package including a package substrate according to the inventive concept.

FIG. 8 is a cross-sectional view showing a semiconductor package including a package substrate according to the inventive concept. Among the contents of FIG. 8, to the extent that an element has not been described in detail, it may be assumed that the element is at least similar to a corresponding element that has been described with reference to FIGS. 1 to 7.

Referring to FIG. 8, the semiconductor package 3 includes a heat dissipation member 84a attached to the upper surface (e.g., the second surface) of the semiconductor chip 10 with a TIM layer 82 arranged therebetween.

The heat dissipation member 84a may extend from the semiconductor chip 10 onto a portion adjacent to the edge of the package substrate 100. An adhesive member 86 may be arranged between the portion adjacent to the edge of the package substrate 100 and the heat dissipation member 84a. The semiconductor chip 10 may be disposed in a space defined between the package substrate 100 and the heat dissipation member 84a.

Figure 9:
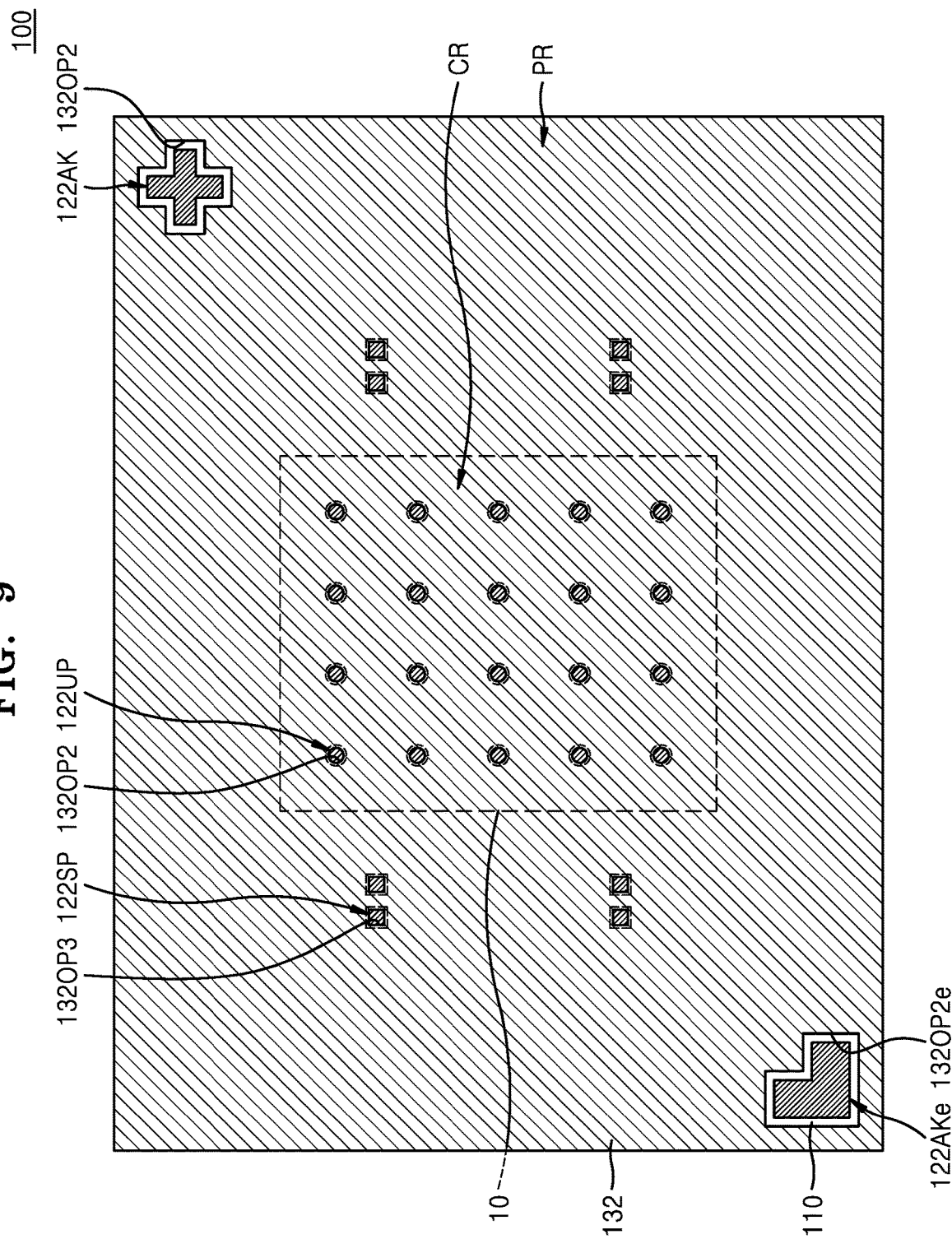
FIG. 9 is a plan view taken from above a package substrate according to the inventive concept.

FIG. 9 is a plan view taken from above the package substrate according to the inventive concept. Among the contents of FIG. 9, to the extent that an element has not been described in detail, it may be assumed that the element is at least similar to a corresponding element that has been described with reference to FIGS. 1 to 8.

Referring to FIG. 9, the package substrate 100 may include a chip attachment region CR on which the semiconductor chip 10 is disposed and a peripheral region PR on which the semiconductor chip 10 is not attached. In the vertical direction, the chip attachment region CR may overlap the semiconductor chip 10, and the peripheral region PR might not overlap the semiconductor chip 10. At least two alignment patterns 122AK and 122AKe may be disposed in the peripheral region PR. At least two alignment patterns 122AK and 122AKe each may be disposed adjacent to the edge of the package substrate 100, in a plan view. For example, the two alignment patterns 122AK and 122AKe may be disposed adjacent to two edges of the package substrate 100 corresponding to each other, in a plan view, in a diagonal direction.

Each of the two alignment patterns 122AK and 122AKe disposed adjacent to two edges of the package substrate 100 corresponding to each other in the diagonal direction may have different shapes, in a plan view.

In some embodiments, an alignment pattern 122AK (hereinafter referred to as a first alignment pattern) having a shape, in a plan view, shown in FIG. 4A may be disposed adjacent to one edge of the two edges of the package substrate 100 corresponding to each other in the diagonal direction, and an alignment pattern 122AKe (hereinafter referred to as second alignment pattern) having a shape, in a plan view, shown in FIG. 4E may be disposed adjacently to the other edge, but the inventive concept is not necessarily limited thereto. For example, among the alignment patterns 122AK, 122AKa, 122AKb, 122AKc, 122AKd, and 122AKe shown in FIGS. 4A, 5A, 5B, 5C, 5D, and 5E, alignment patterns having different shapes, in a plan view, may be disposed on each of the two edges of the package substrate 100 corresponding to each other in the diagonal direction. Alternatively, for example, alignment patterns 122AK, 122AKa, 122AKb, 122AKc, 122AKd, and 122AKe shown in FIGS. 4A, 5A, 5B, 5C, 5D, and 5E, and an alignment pattern having a different shape, in a plan view, from among other alignment patterns having at least three vertices but having a different shape, in a plan view, may be disposed on each of the two edges of the package substrate 100 corresponding to each other in the diagonal direction.

FIG. 10 is a plan view taken from above the package substrate according to the inventive concept. Among the contents of FIG. 10, to the extent that an element has not been described in detail, it may be assumed that the element is at least similar to a corresponding element that has been described with reference to FIGS. 1 to 9.

Referring to FIG. 10, the package substrate 100 may include a chip attachment region CR on which the semiconductor chip 10 is disposed and a peripheral region PR on which the semiconductor chip 10 is not attached. In the vertical direction, the chip attachment region CR may overlap the semiconductor chip 10, and the peripheral region PR might not overlap the semiconductor chip 10. At least four alignment patterns 122AK and 122AKe may be disposed in the peripheral region PR. At least four alignment patterns 122AK and 122AKe each may be disposed adjacent to the edge of the package substrate 100, in a plan view. For example, the four alignment patterns 122AK and 122AKe may be disposed adjacent to the four edges of the package substrate 100 in a plan view.

Two alignment patterns 122AK (hereinafter referred to as a first alignment pattern) disposed adjacent to two edges of the package substrate 100 corresponding to each other in a diagonal direction may have the same shape, in a plan view, and two alignment patterns 122AKe (hereinafter referred to as a second alignment pattern) disposed adjacent to the other two edges of the package substrate 100 corresponding to each other may have a shape, in a plan view, that is different from that of the first alignment pattern 122AK, but may have different shapes, in a plan view, that are the same as each other. In some embodiments, the first alignment pattern 122AK may have a shape, in a plan view, shown in FIG. 4A, and the second alignment pattern 122AKe may have a shape, in a plan view, shown in FIG. 4E, but the inventive concept is not necessarily limited thereto.

For example, alignment patterns 122AK, 122AKa, 122AKb, 122AKc, 122AKd, and 122AKe shown in FIGS. 4A, 5A, 5B, 5C, 5D, and 5E and at least two alignment patterns having different shapes, in a plan view, among other alignment patterns having different shapes, in a plan view, and having at least three vertices may be disposed on the four edges of the package substrate 100.

While the inventive concept has been particularly shown and described with reference to embodiments thereof, it will be understood that various changes in form and details may be made therein without departing from the spirit and scope of the disclosure.

What is claimed is:

1. A package substrate, comprising:
at least one substrate base;
a plurality of wiring patterns disposed on an upper surface and a lower surface of the at least one substrate base and extending in a horizontal direction;
a plurality of wiring vias extending in a vertical direction through the at least one substrate base to electrically connect two wiring patterns positioned at different vertical levels among the plurality of wiring patterns, to each other; and
an upper surface solder resist layer having a plurality of first upper surface openings extending from an upper surface of the upper surface solder resist layer to a lower surface of the upper surface solder resist layer, and at least two second upper surface openings having a second opening width as a horizontal width that is greater than a first opening width, which is a horizontal width of the plurality of first upper surface openings, the upper surface solder resist layer covering the upper surface of the at least one substrate base,
wherein the plurality of wiring patterns comprises a plurality of upper surface connection pads disposed in the plurality of first upper surface openings on the upper surface of the at least one substrate base and having a circular or elliptical shape, and at least two alignment patterns disposed in the at least two second upper surface openings on the upper surface of the at least one substrate base and having a vertex shape,
wherein, in at least one of the plurality of first upper surface openings, a portion of the upper surface of the at least one substrate base is entirely covered by at least one of the plurality of upper surface connection pads, and
wherein, in the at least two second upper surface openings, a portion of the upper surface of the at least one substrate base is covered by the at least two alignment patterns, and the remaining portion of the upper surface of the at least one substrate base is not covered by the at least two alignment patterns.

2. The package substrate of claim 1, wherein the plurality of upper surface connection pads are disposed in a chip attachment region, and
wherein the at least two alignment patterns are disposed in a peripheral region at least partially surrounding the chip attachment region.

3. The package substrate of claim 1, wherein each of the at least two alignment patterns is adjacent to different edges of the upper surface of the at least one substrate base.

4. The package substrate of claim 1, wherein a thickness of the upper surface solder resist layer covering the upper surface of the at least one substrate base is greater than a thickness of each of the plurality of upper surface connection pads and a thickness of each of the at least two alignment patterns.

5. The package substrate of claim 1, wherein a portion of a side surface of the upper surface solder resist layer defining the at least two second upper surface openings and a portion of a side surface of the at least two alignment patterns are spaced apart from each other by a first interval that is less than the first opening width in a horizontal direction.

6. The package substrate of claim 1, wherein the second opening width is at least 5 times greater than the first opening width.

7. The package substrate of claim 1, wherein the at least two alignment patterns each have a polygonal shape, an L-shape having a width, a cross-shape having a width, or a ring-shape with refracted vertices.

8. The package substrate of claim 1, wherein the at least two alignment patterns each have at least three vertices, and wherein the at least three vertices are convex vertices, or convex vertices and concave vertices.

9. A semiconductor package, comprising:
a package substrate having a chip attachment region and a peripheral region at least partially surrounding the chip attachment region;
a semiconductor chip that includes a first surface and a second surface opposite to each other and further includes a plurality of chip pads on the first surface, the first surface facing an upper surface of the package substrate and attached to the chip attachment region of the package substrate; and
a plurality of chip connectors attached to the plurality of chip pads,
wherein the package substrate comprises:
at least one substrate base;
an upper surface solder resist layer covering an upper surface of the at least one substrate base, having a plurality of first upper surface openings in the chip attachment region and at least two second upper surface openings in the peripheral region having a second opening width as a horizontal width that is greater than a first opening width that is a horizontal width of the plurality of first upper surface openings;
a plurality of upper surface connection pads disposed in the plurality of first upper surface openings on the upper surface of the at least one substrate base and having a circular or elliptical shape, and having the plurality of chip connectors attached thereto; and
at least two alignment patterns in the at least two second upper surface openings on the upper surface of the at least one substrate base and having a shape with at least three vertices,
wherein the upper surface solder resist layer covers all side surfaces of the plurality of upper surface connection pads, but does not cover at least a portion of side surfaces of the at least two alignment patterns.

10. The semiconductor package of claim 9, wherein the upper surface of the at least one substrate base is fully covered by at least one of the plurality of upper surface connection pads in at least one of the first upper surface openings, and a portion of the upper surface of the at least one substrate base is covered by the alignment patterns in the at least one of the two second upper surface openings and the remaining portion of the upper surface of the at least one substrate base is not covered.

11. The semiconductor package of claim 10, wherein an upper surface and a side surface of at least one of the plurality of upper surface connection pads are fully covered by the plurality of chip connectors and the upper surface solder resist layer, and
wherein an upper surface and the side surfaces of the at least two alignment patterns are not covered by the upper surface solder resist layer and are externally exposed.

12. The semiconductor package of claim 9, wherein each of the at least two alignment patterns is adjacent to different edges of the upper surface of the at least one substrate base.

13. The semiconductor package of claim 9, wherein at least one of the plurality of upper surface connection pads has a first horizontal width equal to or greater than the first opening width, and
wherein the alignment patterns have a second horizontal width that is greater than the first horizontal width.

14. The semiconductor package of claim 13, wherein a portion of a side surface of the upper surface solder resist layer defining the at least two second upper surface openings and a portion of the side surfaces of the at least two alignment patterns are spaced apart from each other by a first interval that is less than the first opening width in a horizontal direction.

15. The semiconductor package of claim 9, wherein the package substrate further comprises:
a lower surface solder resist layer covering a lower surface of the at least one substrate base and having a plurality of lower surface openings; and
a plurality of lower surface connection pads in the plurality of lower surface openings on the lower surface of the at least one substrate base, having a plurality of external connection terminals attached, and electrically connected to the plurality of upper surface connection pads.

16. The semiconductor package of claim 15, wherein the plurality of lower surface connection pads are on the lower surface of the at least one substrate base in the chip attachment region and the peripheral region.

17. The semiconductor package of claim 9, wherein an upper surface of the upper surface solder resist layer is located at a vertical level that is higher than an upper surface of each of the upper surface connection pad and the at least two alignment patterns.

18. A semiconductor package, comprising:
a package substrate having a chip attachment region and a peripheral region at least partially surrounding the chip attachment region;
a semiconductor chip including a first surface and a second surface opposite to each other and further includes a plurality of chip pads disposed on the first surface, the first surface facing an upper surface of the package substrate and attached to the chip attachment region of the package substrate; and
a plurality of chip connectors attached to the plurality of chip pads,
wherein the package substrate comprises:
at least one substrate base;
an upper surface solder resist layer covering an upper surface of the at least one substrate base and having a plurality of first upper surface openings in the chip attachment region and at least two second upper surface openings having a second opening width that is greater than a first opening width that is a horizontal width of the plurality of first upper surface openings and disposed in the peripheral region;
a lower surface solder resist layer covering a lower surface of the at least one substrate base and having a plurality of lower surface openings in the chip attachment region and the peripheral region;
a plurality of upper surface connection pads in the plurality of first upper surface openings disposed on the upper surface of the at least one substrate base and having a circular or elliptical shape, and having the plurality of chip connectors thereto;
at least two alignment patterns disposed in the at least two second upper surface openings on the upper surface of the at least one substrate base and having a shape with at least three vertices;
a plurality of lower surface connection pads disposed in the plurality of lower surface openings on the lower surface of the at least one substrate base; and
a plurality of external connection terminals attached to the plurality of lower surface connection pads,
wherein the upper surface solder resist layer covers all side surfaces of the plurality of upper surface connection pads, but does not cover at least a portion of side surfaces of the at least two alignment patterns, and wherein a portion of a side surface of the upper surface solder resist layer defining the at least two second upper surface openings and a portion of the side surfaces of the at least two alignment patterns are spaced apart from each other by a first interval that is less than the first opening width in a horizontal direction.

19. The semiconductor package of claim 18, wherein the plurality of upper surface connection pads and the at least two alignment patterns include a same material.

20. The semiconductor package of claim 18, wherein the first opening width is from about 50 μm to about 150 μm, and wherein the second opening width is at least 5 times greater than the first opening width, and is about 250 μm to about 1000 μm.

* * * * *